United States Patent
Rajagopalan et al.

(10) Patent No.: US 6,274,058 B1
(45) Date of Patent: Aug. 14, 2001

(54) REMOTE PLASMA CLEANING METHOD FOR PROCESSING CHAMBERS

(75) Inventors: Ravi Rajagopalan, Sunnyvale; Patricia M. Liu, Saratoga; Pravin K. Narwankar; Huyen Tran, both of Sunnyvale; Padmanabhan Krishnaraj, San Francisco; Alan Ablao, San Jose; Tim Casper, Monte Sereno, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/347,236

(22) Filed: Jul. 2, 1999

Related U.S. Application Data

(63) Continuation-in-part of application No. 08/893,922, filed on Jul. 11, 1997, now Pat. No. 6,125,859.

(51) Int. Cl.⁷ ..................................................... H05H 1/00
(52) U.S. Cl. .............................. 216/67; 216/69; 438/905; 134/22.1
(58) Field of Search ............................... 134/22.1, 22.11; 216/67, 69; 438/905

(56) References Cited

U.S. PATENT DOCUMENTS

| | | |
|---|---|---|
| 4,433,228 | 2/1984 | Nishimatsu et al. . |
| 4,576,692 | 3/1986 | Fukuta et al. . |
| 4,736,304 | 4/1988 | Doehler . |
| 4,831,963 | 5/1989 | Saito et al. . |
| 4,898,118 | 2/1990 | Murakami et al. . |
| 4,909,184 | 3/1990 | Fujiyama . |
| 4,946,549 | 8/1990 | Bachman et al. . |
| 4,960,071 | 10/1990 | Akahori et al. . |
| 4,986,214 | 1/1991 | Zumoto et al. . |
| 4,996,077 | 2/1991 | Moslehi et al. . |
| 5,008,593 | 4/1991 | Schlie et al. . |
| 5,082,517 | 1/1992 | Moleshi . |

(List continued on next page.)

FOREIGN PATENT DOCUMENTS

| | | |
|---|---|---|
| 03739895A1 | 6/1988 | (DE) . |
| 04107329A1 | 9/1991 | (DE) . |
| 04132561A1 | 4/1993 | (DE) . |
| 04202862A1 | 8/1993 | (DE) . |
| 0343038A1 | 5/1988 | (EP) . |
| 343038A1 | 11/1989 | (EP) . |
| 0697467A1 | 10/1995 | (EP) . |
| 61-14726 | 1/1986 | (JP) . |
| 63-48832 | 3/1988 | (JP) . |
| 1-102921 | 4/1989 | (JP) . |
| 2-125876 | 5/1990 | (JP) . |
| 4-100221 | 4/1992 | (JP) . |
| 4-137618 | 5/1992 | (JP) . |
| 4-165075 | 6/1992 | (JP) . |
| 5-90180 | 4/1993 | (JP) . |
| 5-90426 | 4/1993 | (JP) . |
| 6-318580 | 11/1994 | (JP) . |
| 8-85885 | 4/1996 | (JP) . |

*Primary Examiner*—Thi Dang
(74) *Attorney, Agent, or Firm*—Blakely Sokoloff Taylor & Zafman

(57) ABSTRACT

A processing chamber cleaning method is described which utilizes microwave energy to remotely generate a reactive species to be used alone or in combination with an inert gas to remove deposits from a processing chamber. The reactive species can remove deposits from a first processing region at a first pressure and then remove deposits from a second processing region at a second pressure. Also described is a cleaning process utilizing remotely generated reactive species in a single processing region at two different pressures. Additionally, different ratios of reactive gas and inert gas may be utilized to improve the uniformity of the cleaning process, increase the cleaning rate, reduce recombination of reactive species and increase the residence time of reactive species provided to the processing chamber.

21 Claims, 12 Drawing Sheets

U.S. PATENT DOCUMENTS

| | | |
|---|---|---|
| 5,084,126 | 1/1992 | McKee . |
| 5,111,111 | 5/1992 | Stevens et al. . |
| 5,133,825 | 7/1992 | Hakamata et al. . |
| 5,134,965 | 8/1992 | Tokuda et al. . |
| 5,158,644 | 10/1992 | Cheung et al. . |
| 5,173,641 | 12/1992 | Imahashi et al. . |
| 5,211,796 | 5/1993 | Hansen . |
| 5,211,995 | 5/1993 | Kuehnle et al. . |
| 5,234,526 | 8/1993 | Chen et al. . |
| 5,234,529 | 8/1993 | Johnson . |
| 5,266,364 | 11/1993 | Tamura et al. . |
| 5,282,899 | 2/1994 | Balmashnov et al. . |
| 5,306,985 | 4/1994 | Berry . |
| 5,364,519 | 11/1994 | Fujimura et al. . |
| 5,387,288 | 2/1995 | Shatas . |
| 5,401,358 | 3/1995 | Kadomura . |
| 5,405,492 | 4/1995 | Molsehi . |
| 5,413,670 | 5/1995 | Langan et al. . |
| 5,449,434 | 9/1995 | Hooke et al. . |
| 5,451,615 | 9/1995 | Krogh . |
| 5,454,903 | 10/1995 | Redeker et al. . |
| 5,462,602 | 10/1995 | Misiano et al. . |
| 5,466,991 | 11/1995 | Berry . |
| 5,474,615 | 12/1995 | Ishida et al. . |
| 5,489,362 | 2/1996 | Steinhardt et al. . |
| 5,491,112 | 2/1996 | Buchta et al. . |
| 5,503,676 | 4/1996 | Shufflebotham et al. . |
| 5,520,771 | 5/1996 | Kanai et al. . |
| 5,540,812 | 7/1996 | Kadomura . |
| 5,545,289 | 8/1996 | Chen et al. . |
| 5,558,717 | 9/1996 | Zhao et al. . |
| 5,567,241 | 10/1996 | Tsu et al. . |
| 5,611,863 | 3/1997 | Miyagi . |
| 5,626,679 | 5/1997 | Shimizu et al. . |

ENLARGED VIEW A

REMOTE PLASMA CLEANING METHOD FOR PROCESSING CHAMBERS

FIELD OF THE INVENTION

This application is a continuation-in-part of application Ser. No. 08/893,922 entitled "Improved Cleaning Process" filed Jul. 11, 1997 and commonly assigned to Applied Materials, Inc, now U.S. Pat. No. 6,125,859.

This invention relates generally to methods and apparatuses suitable for removing accumulated processing by-products and unwanted deposits within processing reactors. More particularly, this invention relates to a method for cleaning the internal components of a wafer processing apparatus after the deposition of Tantalum containing films, such as Tantalum Pentaoxide ($Ta_2O_5$). Additionally, the method described is suitable for removing deposits formed by other processes useful in the manufacture of semiconductor devices and flat panel displays.

BACKGROUND OF THE INVENTION

The desire for greater capacity integrated circuits (ICs) on smaller sized devices has increased interest in replacing today's 64 megabit DRAM with memory devices in the range of 256 megabit, 1 gigabit and higher. This need for increased capacity on the same or smaller substrate footprint device makes it necessary to replace conventional dielectric films previously used in stacked capacitor formation, such as silicon dioxide ($SiO_2$), with dielectric films having higher dielectric constants. Capacitors containing high-dielectric constant materials, such as $Ta_2O_5$, usually have much larger capacitance densities than standard $SiO_2$—$Si_3N_4$—$SiO_2$ stack capacitors making them the materials of choice in IC fabrication. High dielectric constant films allow smaller capacitor areas which in turn enable closer spacing of transistors and increased transistor density. One material of increasing interest for stack capacitor fabrication is Tantalum Pentaoxide which has a relative dielectric constant more than six times that of $SiO_2$. Accompanying the increased and expanding use of this material is a need for improved in-situ methods of removing unwanted deposits which accumulate within the processing chamber after repeated deposition cycles.

An available cleaning method involves the utilization of a remote plasma generator to produce reactive species which are delivered to the processing chamber. U.S. Pat. No. 5,449,411 issued Sep. 12, 1995, to Hitachi describes a process for cleaning a vacuum chamber prior to the deposition of $SiO_2$ therein. A microwave plasma of process gases such as $C_2F_6$, $CF_4$, $CHF_3$, $CH_6$, $F_2$, HF, $Cl_2$ or HCl is described. The patent further describes that the cleaning process can be improved by applying an R.F. electric field to electrodes in the chamber.

U.S. Pat. Nos. 5,778,788 issued Aug. 4, 1998, to Applied Komatsu Technology, describes a method for cleaning a deposition chamber that is used in fabricating electronic devices by activating a precursor gas using a high power microwave source of between about 3,000 to 12,000 Watts or a power density in the remote chamber of about 12,000 Watts/liter to 48,000 Watts/Liter. The patent further describes a minor carrier gas such as Argon, nitrogen, helium, hydrogen or oxygen may be used to transport the reactive species to the chamber, assist in the cleaning process, or help initiate and or stabilize the plasma in the deposition chamber. The patent also describes the use of a chamber based excitation source used to further excite the reactive species provided to the chamber.

Another problem confronting the semiconductor industry is the increased cost to obtain process gases coupled with the increased costs of disposing of the exhaust by-products created by process gases. The cleaning gas NF3 is an illustrative example of this problem. Long recognized as a superior cleaning gas, the cost of purchasing NF3 has steadily increased. What is needed is an improved remote plasma chamber cleaning process which utilizes cleaning gases more efficiently resulting in an overall decrease in gas consumption. The improved process should rely solely on remote microwave excitation sources without requiring chamber based excitation to produce an effective plasma or remove chamber deposits. The decreased gas consumption lowers gas supply cost, CFC generation and gas disposal cost. More specifically, the improved method should be capable of providing commercially viable cleaning rates for dielectric films such as $Ta_2O_5$.and other dielectric films.

SUMMARY OF THE INVENTION

An embodiment of the present invention is a method of cleaning from a processing chamber deposits formed on interior surfaces of the processing chamber wherein said processing chamber interior surfaces include a first region and a second region said second region being different from said first region, said method comprising the steps of: dissociating a gas mixture outside said processing chamber to form reactive species, said gas mixture comprising an inert gas and a cleaning gas; providing said reactive species to said processing chamber; reacting said reactive species with said deposits in said processing chamber first region; forming volatile compounds from said deposits formed in said processing chamber first region; removing from said processing chamber said volatile compounds formed from deposits formed in said processing chamber first region; increasing the fluid communication between said processing chamber first and second regions; reacting said reactive species with said deposits in said processing chamber second region; forming volatile compounds from said deposits formed in said processing chamber second region; and removing from said processing chamber said volatile compounds formed from deposits formed in said processing chamber second region.

Another embodiment of the present invention is a method of removing deposits formed in a processing chamber as a result of deposition operations performed on a substrate disposed within the processing chamber, the method comprising the steps of activating a cleaning gas in a remote chamber separate from said processing chamber to form reactive species from said cleaning gas; providing an inert gas which mixes with said reactive species to form a gas mixture comprising reactive species; providing said gas mixture to said processing chamber while maintaining said processing chamber at a first pressure; while maintaining said processing chamber at said first pressure, reacting said reactive species with said deposits to form volatile compounds and thereafter removing from said processing chamber said volatile compounds formed at said first pressure; providing said gas mixture comprising reactive species to said processing chamber while maintaining said processing chamber at a second pressure that is different from said first pressure; while maintaining said processing chamber at said second pressure, reacting said reactive species with said deposits to form volatile compounds and thereafter removing from said processing chamber said volatile compounds formed at said second pressure; and conducting processing operations in said processing chamber to form a film on interior surfaces of said processing chamber without a substrate disposed within said chamber.

DETAILED DESCRIPTION OF THE INVENTION

The present invention is directed to a novel in-situ cleaning process for removal of accumulated processing by-products on interior surfaces of a processing chamber. The described embodiment uses a resistively heated CVD chamber. One example of this type of chamber is an xZ style single wafer processing chamber manufactured by Applied Materials, modified as described herein. The chamber described is part of a modular processing system which can be utilized for a wide variety of semiconductor processing technologies such as the thermal deposition of Tantalum Pentaoxide ($Ta_2O_5$). Although the description and embodiments which follow are described with relation to the deposition and cleaning of $Ta_2O_5$ comprising films, one skilled in the art will appreciate that the methods set forth in the present invention are adaptable to commercially available processing systems and operations without departing from the scope of the present invention. In some instances, well known semiconductor processing equipment and methodology have not been described in order not to unnecessarily obscure the present invention.

Figure 1:
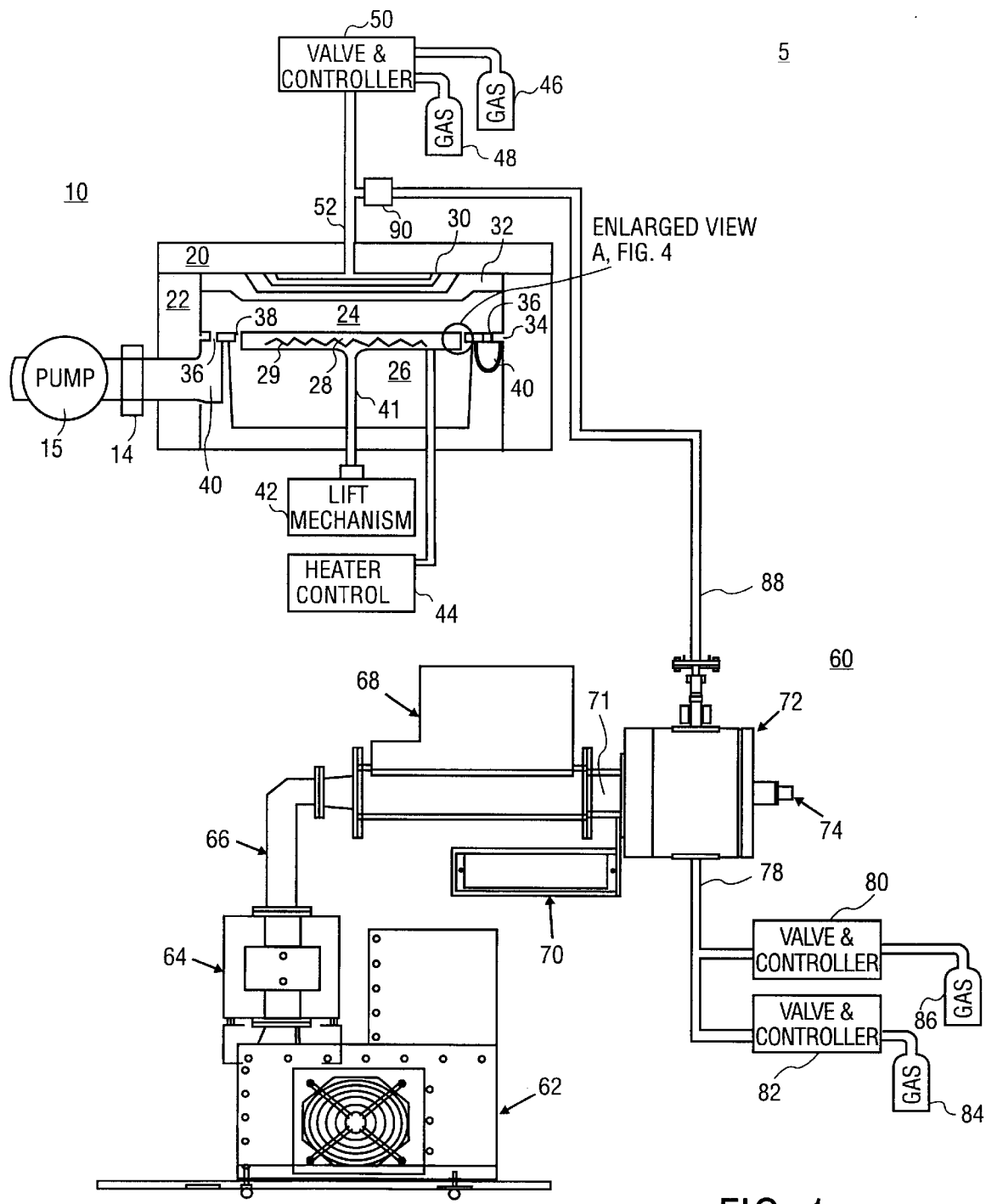
FIG. 1 is a cross sectional and schematic view of a processing system of the present invention.

FIG. 1 is a schematic view of a processing system 5 of the present invention which contains processing chamber 10 and remote plasma generator 60. Processing chamber 10 is comprised of a lid 20 and chamber body 22 which together form an evacuable, temperature controlled processing environment. Lid 20 and chamber body 22 are typically made from rigid materials having good thermal characteristics. For example, chamber lid 20 and body 22 could be formed from aluminum.

In the representative embodiment shown in FIG. 1, a resistively heated substrate support 28 is provided within chamber 10 to support a workpiece and provide the heat of reaction for a thermal deposition reaction such as, for example, the deposition of $Ta_2O_5$ by decomposition of Tantalum precursors such as (Ta $(OC2H_5)_5$) or TAETO and Tantalum Tetraethoxide Dimethylaminoethoxide (Ta $(OEt)_4$ $(OCH_2CH_2N(Me)_2)$ or TAT-DMAE. Power provided to resistive heater 29 within substrate support 28 is adjusted by heater controller 44. Power to heater 29 is adjusted to provide adequate temperature for the desired processing operation to be performed within chamber 10. The vertical position of substrate support 28 within chamber 10 is controlled by lift mechanism 42. Support shaft 41 couples substrate support 28 to lift mechanism 42. The position of substrate support 28 within chamber 10 or spacing is the separation between the lower surface of showerhead 32 and the upper surface of substrate support 28. Spacing is measured in thousandths of an inch or mils with larger spacing indicating increasing separation between showerhead 32 and substrate support 28. Components within chamber 10 typically have a protective coating or are fabricated from durable materials which tolerate exposure to the relatively high temperatures and often caustic chemical environments used in the fabrication of electronic components. For example, showerhead 32 could be formed from aluminum. Graphite and ceramic compositions are often employed in the fabrication of substrate supports 28 and support shafts 41.

Pump 15 and throttle valve 14 are used in conjunction to evacuate chamber 10 and provide a pressure regulated environment within chamber 10. Pump 15 is in communication with pumping channel 40 located in the periphery of walls 22 and encircling substrate support 28. Pumping plate 34 is provided with a plurality of apertures 36 which provide more uniform conduction and evacuation of chamber interior regions 24 and 26. Spacing 38 separates substrate support 28 from pumping plate 34. For the representative chamber 10 of FIG. 1, spacing 38 is between about 0.112 inches and 0.088 inches. Thus, substrate support 28 and pumping plate 34 in effect divide the interior of chamber 10 into an upper interior region 24 and a lower interior region 26. Upper interior region 24 also includes showerhead 32 and gas distribution plate 30.

Processing gases are stored outside chamber 10 in gas supplies 46 and 48. Valve and controller 50 represents an electronic metering and control system such as a mass flow controller used to introduce gases into chamber 10. From valve and controller 50, gases from supplies 46 and 48 flow through chamber supply piping 52, lid 20, gas distribution plate 30 and showerhead 32 before entering interior chamber regions 24 and 26. Although shown using a single valve and controller 50, gas supplies 46 and 48 could also be controlled by independent valve and controller unit 50 depending upon the process desired within chamber 10.

Also illustrated in FIG. 1 is remote plasma generating system 60 which is used to activate gases and provide the resulting reactive species to chamber interior regions 24 and 26. One advantage of a remote plasma generator 60 is that the generated plasma or reactive species created by remote plasma generator 60 may be used for cleaning or process applications within internal chamber processing regions 24 and 26 without subjecting internal chamber components such as substrate support 28, shower head 32, or pumping plate 34 to ion bombardment which usually results when RF energy is applied within interior processing regions 24 and 26 to create a plasma. Reactive species generated by remotely activated plasma are considered less damaging since they do not subject internal chamber components to ion bombardment.

Another advantage of a remote excitation cleaning method of the present invention over some chamber based excitation cleaning methods is that in a remote excitation cleaning method the chamber conditions, such as temperature, may be maintained at or near the conditions associated to the process to be conducted in the chamber. For example in a representative embodiment of the present invention where the chamber is used to deposit $Ta_2O_5$ at 475° C., remotely activated species may be provided to the chamber at the same temperature thereby eliminating the extra time required to change chamber temperature between the deposition process and the remotely activated cleaning process.

Turning now to the schematic illustration of remote plasma generator 60 which appears in FIG. 1, the components and operation of remote plasma apparatus 60 of the present invention can be better appreciated. Magnetron assembly 62 houses the magnetron tube, which produces the microwave energy. A representative magnetron tube 62 consists of a hot filament cylindrical cathode surrounded by an anode with a vane array. This anode/cathode assembly produces a strong magnetic field when it is supplied with DC power from a power supply. Electrons coming into contact with this magnetic field follow a circular path as they travel between the anode and the cathode. This circular motion induces voltage resonance, or microwaves, between the anode vanes. An antenna channels the microwaves from magnetron 62 to isolator 64 and wave guide 66. Isolator 64 absorbs and dissipates reflected power to prevent damage to magnetron 62. Wave guide 66 channels microwaves from isolator 64 into tuner 68.

Tuner 68 matches the impedance of magnetron 62 and microwave cavity 72 to achieve the minimum degree of reflected power by adjusting the vertical position of three tuning stubs located inside wave guide 66. Tuner 68 could be adjusted manually or automatically. If an automatic tuner is employed with tuner 68, a feedback signal can be provided to the magnetron power supply in order to continuously match the actual forward power to the setpoint. Auto tuner controller 70 controls the position of the tuning stubs within wave guide 66 to minimize reflected power. Auto tuner controller 70 also displays the position of the stubs as well as forward and reflected power readings.

If a manual tuner is used, the positions of the stubs could be set manually and adjusted as needed to minimize reflected power. Although more expensive than manual tuner controllers, automatic tuner controllers can strike and sustain a plasma with a cleaning gas such as, for example, NF3. Since it is more difficult to strike and sustain a plasma with only a cleaning gas generally an automatic tuner controller is required. With manual tuners, an extra plasma initiation step may be required where an inert gas is flowed through the remote apparatus and the plasma struck. Once the plasma is formed in the applicator with an inert gas, the cleaning gas is introduced. Finally, the flow rate of the cleaning gas is increased to the desired flow condition while the inert gas flow is decreased until the desired gas flow or gas composition is obtained.

Figure 2:
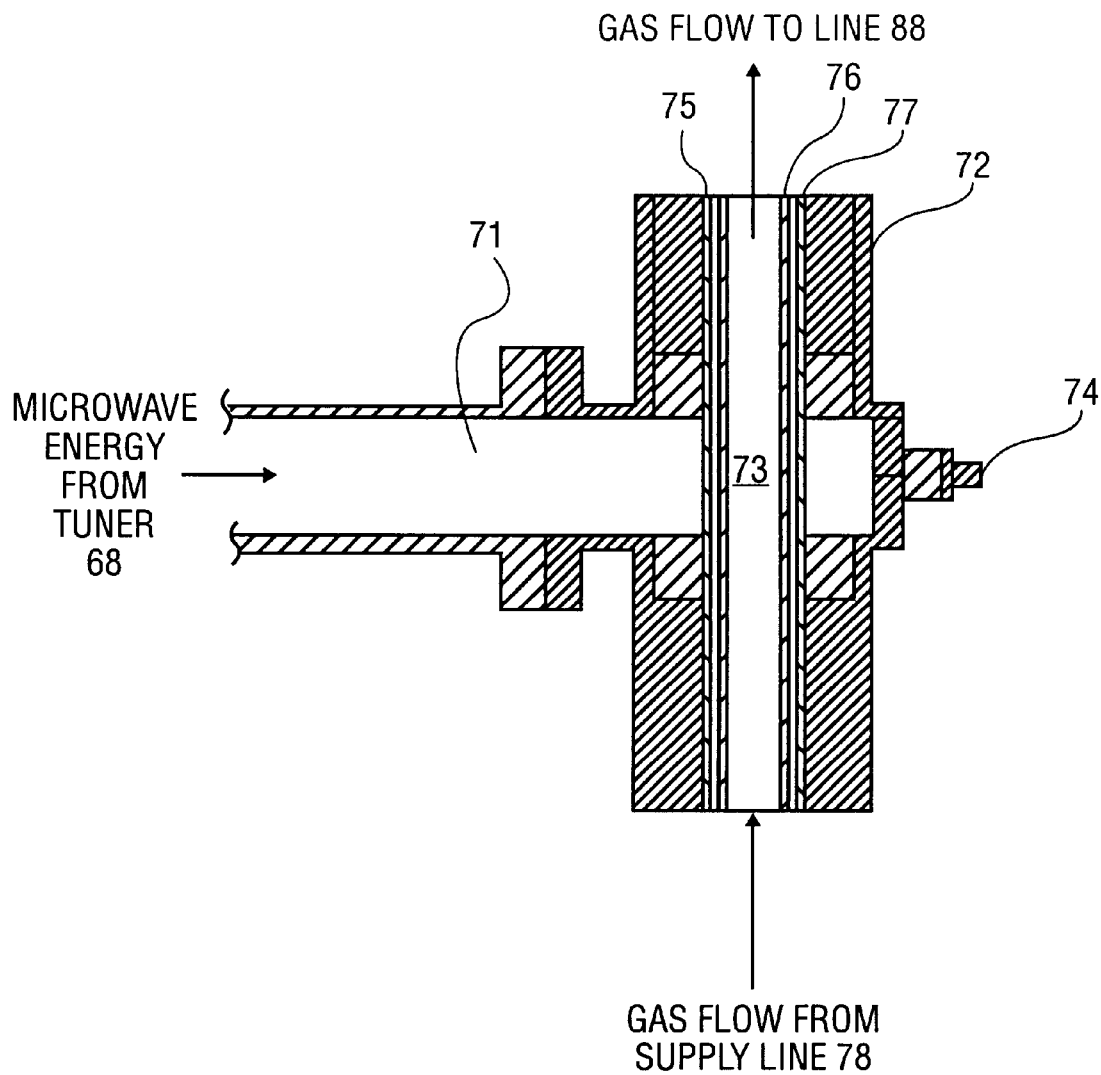
FIG. 2 is a cross sectional view of a remote plasma applicator cavity.

Turning now to FIG. 2 which shows a cross section of microwave applicator cavity 72 where gases from supply line 78 are exposed to microwave energy from magnetron 62. Applicator 72 has a cylindrically shaped sapphire tube 76 located within another cylindrically shaped quartz tube 75. In order to prevent overheating and damage to tubes 75 and 76, cooling water is provided to cooling water channel 77 which separates tubes 75 and 76. Microwave energy exiting tuner 68 travels through microwave channel 71 which is coupled to applicator 72 and positioned such that exiting microwaves are directed towards tubes 75 and 76. Activation volume 73 is formed by the intersection of the cross section of channel 71 and sapphire tube 76. For example, activation volume 73 is about $4.733 \times 10^{-3}$ liters in an embodiment where microwave channel 71 has a rectangular cross section with a height of about 3.4 inches and a width of about 1.7 inches while tube 76 has an inner diameter of 1.04 inches. Representative microwave power settings of between about 1400–3200 Watts result in a power density of between 295,800 W/L to 676,100 W/L within activation volume 73. The power density is scalable and will vary depending on specific geometry of the system and the microwave power utilized. Although described as rectangular and cylindrical, one of ordinary skill in the art will appreciate that other shapes can be employed in microwave channel 71 as well as tubes 75 and 76. Although described as fabricated from sapphire and quartz respectively, tubes 76 and 75 may also be formed from other suitable materials capable of sustained exposure to microwave energy. Additionally, inner tube 76 should be inert to the gases provided from supply line 78.

Gas or gases supplied via gas supply line 78 enter water cooled sapphire tube 76 within microwave applicator 72. The gas or gases subjected to the microwave energy ionizes producing reactive species which can then be used in cleaning and processing operations within processing chamber 10. For example, one such cleaning gas is $NF_3$ which can be used to supply reactive fluorine for cleaning processing chamber interior regions 24 and 26 when a substrate is not present in chamber 10. The microwave power level is one limit on the amount of reactive species created. For example, a microwave power level of about 3500 W is capable of completely dissociating about 1700 sccm of $NF_3$. Gas flows above 1700 sccm may result in incomplete cleaning gas dissociation. An optical plasma sensor 74 detects the existence of plasma within cavity 72. Reactive species generated within microwave applicator cavity 72 are supplied to chamber 10 via chamber supply line 88.

Referring again to FIG. 1, reactive species within chamber supply line 88 pass control valve 90 which could be an on/off valve or part of a diverter valve system. Employing a diverter in valve 90 allows for the continued operation of remote plasma generator while not requiring that reactive species be provided to chamber 10. Once past control valve 90, reactive species from remote plasma generator 60 flow through gas supply line 52, lid 20, gas distribution plate 30 and showerhead 32 before entering chamber interior regions 24 and 26.

Gases to be dissociated in remote plasma generator 60 are stored in gas supplies 86 and 84. Valve and control mechanisms 80 and 82 represent electronic flow control units for gas supplies 86 and 84 respectfully. The output setpoint of valve and flow control mechanisms 80 and 82 is determined by the user and the resulting gas flow output is provided to microwave applicator cavity 72 via supply piping 78. In accordance with the present invention, gas supply 84 could be a source of cleaning gas to be dissociated into reactive species for the removal of deposits formed within chamber 10. Although the present embodiment will be described with respect to the use of $NF_3$, the reactive gas or cleaning gas may be selected from a wide variety of halogens and halogen compounds. For example, the reactive gas may be chlorine, fluorine or compounds thereof, e.g. $NF_3$, $CF_4$, $SF_6$, $C_2F_6$, $CCl_4$, $C_2Cl_6$. Reactive gas selection will depend upon the material to be removed. For example, reactive fluorine may be used to remove or clean accumulations of $Ta_2O_5$ as set forth in a representative embodiment of the present invention.

Also in accordance with the present invention, gas supply 86 is a source of inert gas with a two fold purpose. For those microwave generator apparatus 60 having a manual tuner 60, an inert gas is used to initiate the plasma within microwave applicator cavity 72. Second, in accordance with the ratios described below, the inert gas is flowed concurrently with the reactive gas in order to prevent reactive species recombination thereby increasing the number of reactive species which reach chamber 10. The addition of an inert gas also increases the residence time of those reactive species within chamber 10. Although the ratio between the inert gas and the cleaning or reactive gas is described in relation to flow rates, the ratio of cleaning gas to inert gas could also be determined by any other means to describe the relative amounts of each gas provided to chamber 10.

Figure 5:
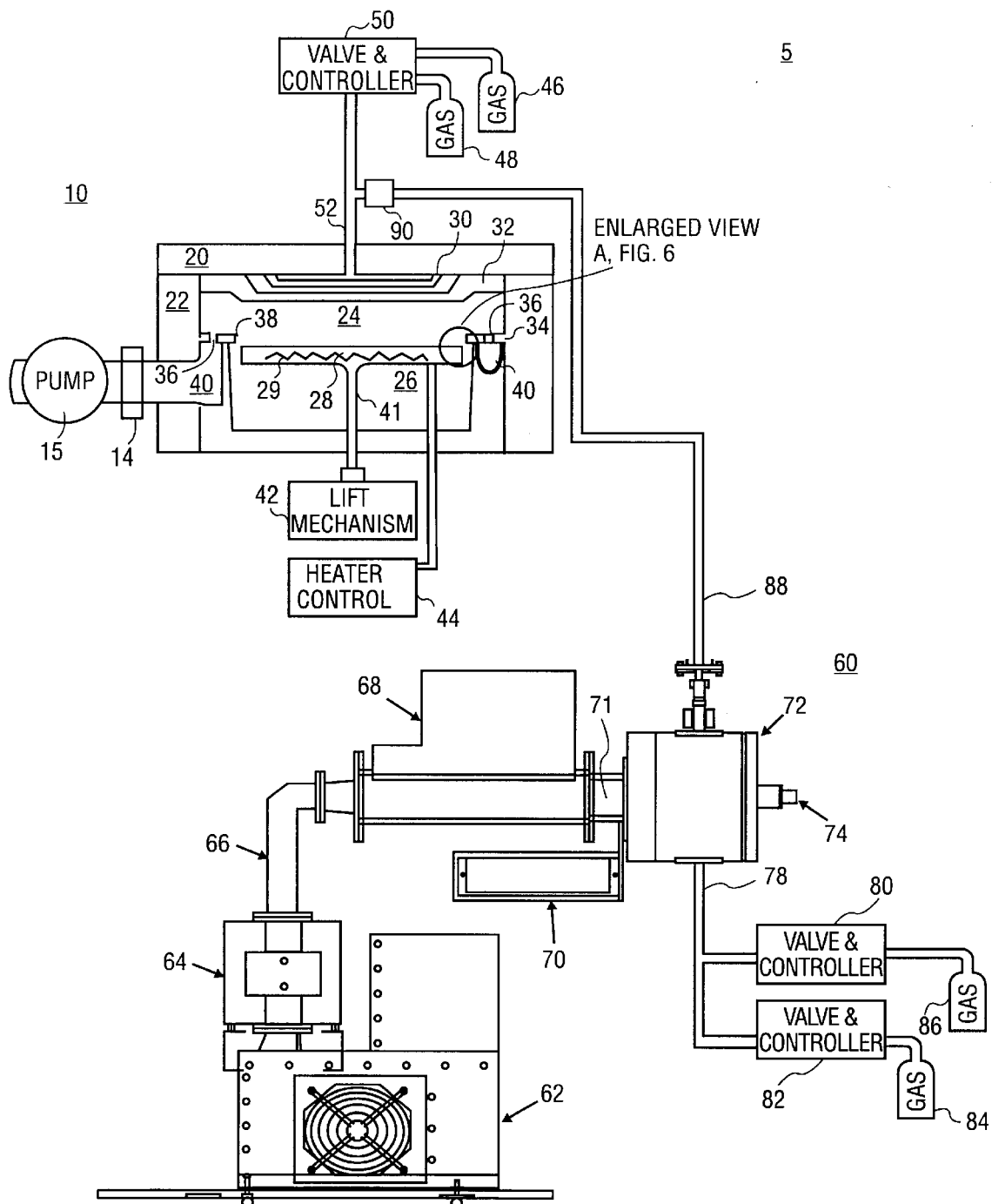
FIG. 5 is a cross sectional and schematic view of a processing system of the present invention.
Figure 7:
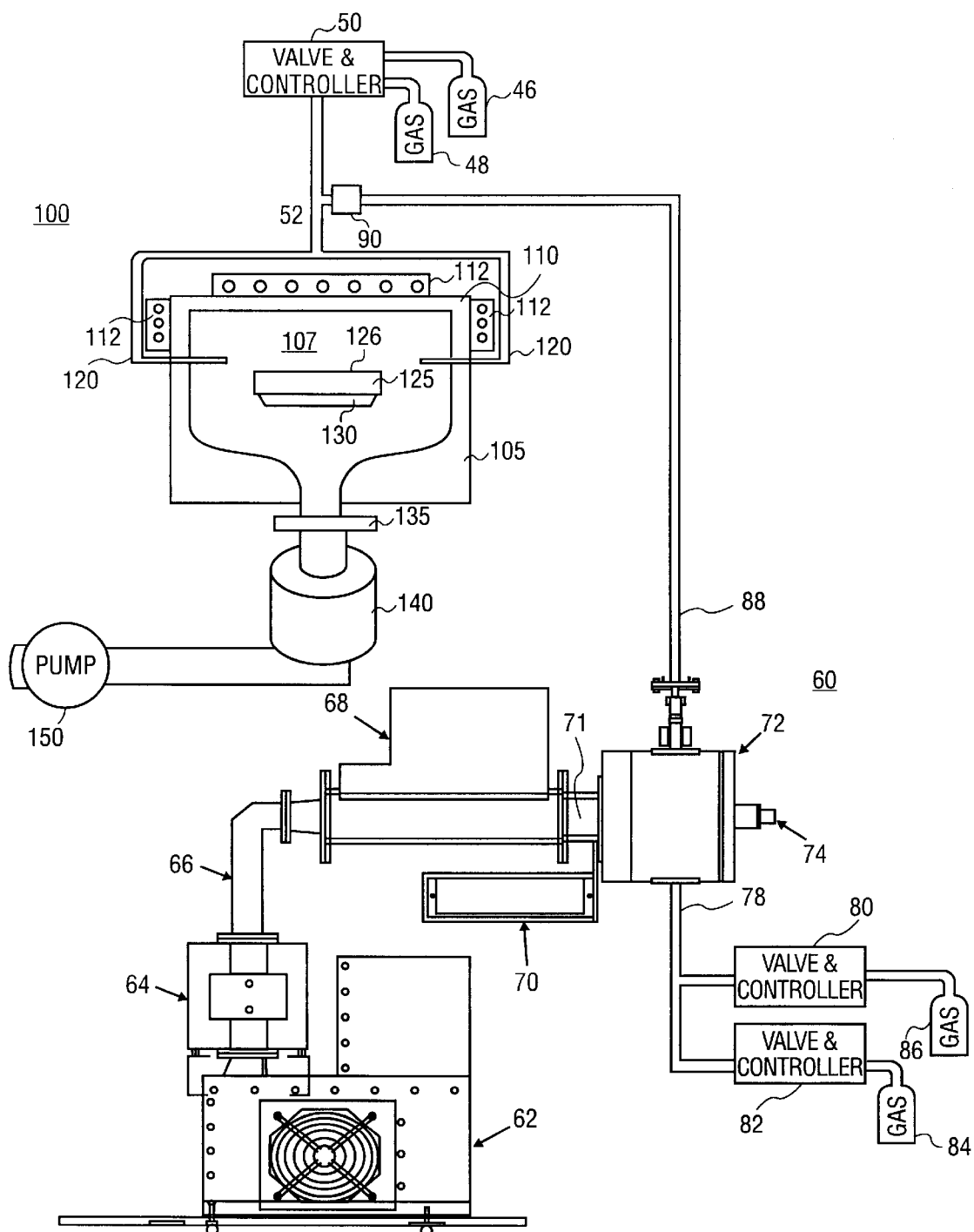
FIG. 7 is a cross sectional and schematic view of a single volume processing chamber and the remote plasma apparatus of the present invention.

Although gas supply 78 is illustrated in FIGS. 1, 5 and 7 as flowing inert gas through applicator 72, it is to be understood that the inert gas could instead be provided to the flow of reactive species at supply line 88. Providing the inert gas into the flow of reactive species down stream of applicator 72 has the additional advantage of increasing the amount of power applied to the cleaning gas flow within applicator 72 since only the cleaning gas flows through applicator 72.

Figure 3:
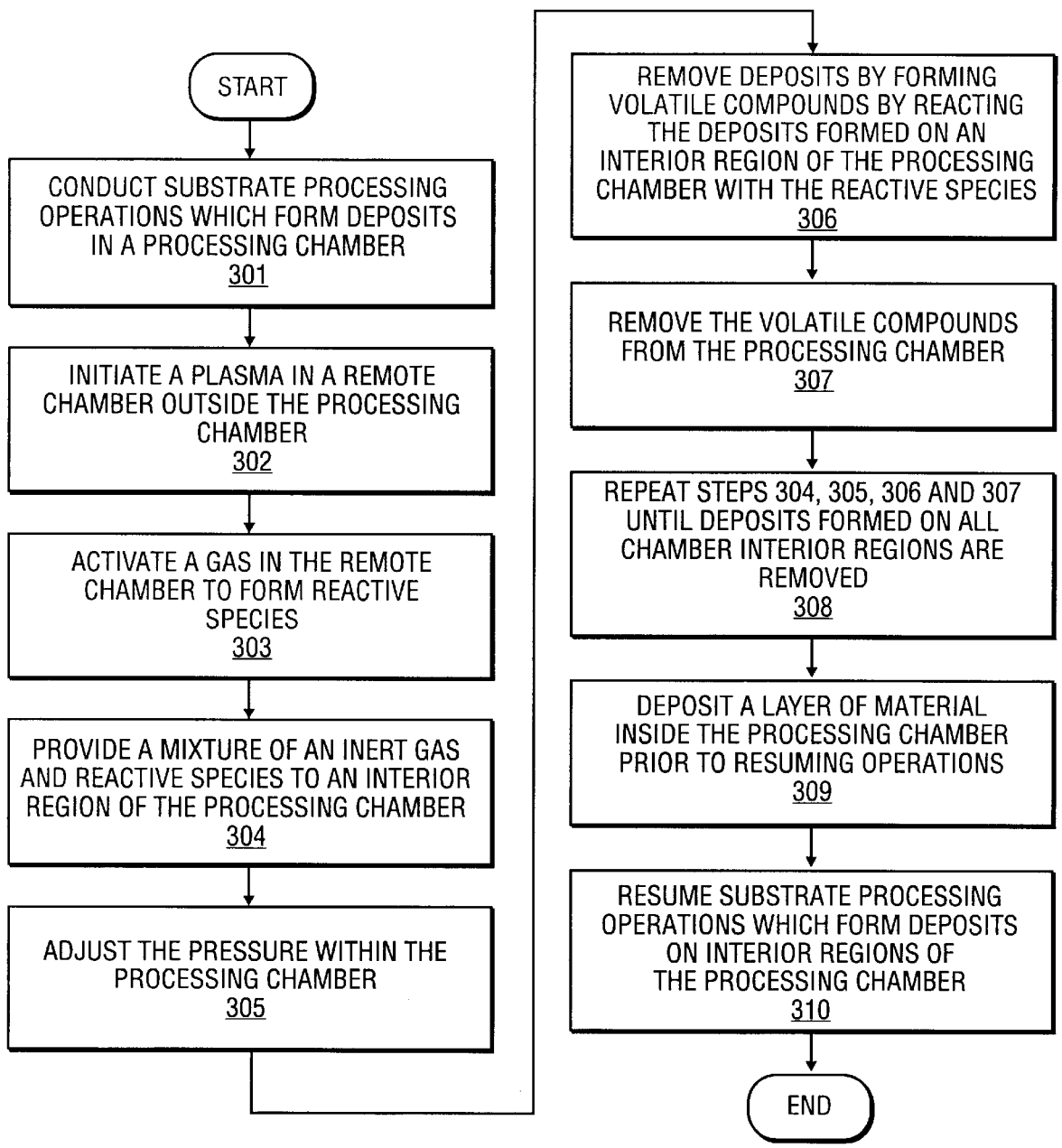
FIG. 3 is a block diagram illustrating a method of the present invention.

The present invention can be carried out in a processing chamber modified to operate in conjunction with a remote plasma generating source as illustrated in FIG. 1. FIG. 3 contains block diagram 300 which sets forth the novel cleaning process of the present invention. The remote plasma cleaning process is set forth in blocks 302–308 of FIG. 3. For purposes of illustration, the method of the present invention will be described as implemented for a processing system similar to processing system 5 of FIG. 1. Accordingly, reference numbers and components shown in FIG. 1 will be used in the description which follows.

The first step of the present invention as set forth in block 301 is to conduct processing operations which results in the formation of deposits within a processing chamber. In this illustration, the processing operation described is for the thermal deposition of tantalum pentaoxide by mixing a tantalum precursor with an oxidizing agent at approximately 450° C. A substrate is placed on resistively heated substrate support and heater controller 44 adjusts the power provided heater 29 to maintain the substrate at an appropriate processing temperature of about 450° C. Lift mechanism 42 positions substrate support 28 and the wafer thereupon in chamber 10 relative to showerhead 32 to a spacing of, for example, 400 mils. Gas supplies 46 and 48 of FIG. 1 contain a oxidizing gas such as oxygen or nitrous oxide and a tantalum precursor such as TAT-DMAE or TAETO. An inert gas such as $N_2$ may be employed as a carrier gas for the Tantalum precursor. Valve and controller mechanism 50 mixes and adjusts the flow rate of the tantalum and oxidizing gases and delivers them to chamber 10. The temperature of the substrate positioned on support 28 is sufficient to form tantalum pentaoxide from the incoming gas stream.

Some processes necessitate cleaning after each substrate is processed. Other processes tolerate periodic cleaning after a consecutive series of processes sequences, or after the deposition of a specified film thickness. One example of periodic cleaning is the deposition of $Ta_2O_5$ where a series of substrates are processed where each substrate receives about 100 angstroms (Å) of $Ta_2O_5$ film. After a number of substrates have been processed in this manner, the chamber is cleaned after the last substrate is removed from the chamber. A typical processing cycle for $Ta_2O_5$ is 500 wafers each with 100 angstroms (Å) or, alternatively, cleaning the chamber once for every 1 micron of film deposited.

Chamber 10, like other deposition chambers, are designed to preferentially deposit film on substrates positioned within the chamber. Deposition will also occur on other surfaces within interior regions 24 and 26 with sufficient temperature to react the process gases. In a restively heated deposition chamber such as chamber 10 which has no means other than thermal energy for activation or to drive reactions, deposition is expected on those surfaces heated because of proximity to resistively heated substrate support such as the lower surface of showerhead 32 , the upper surface of pumping plate 34 and walls 32 surrounding first interior region 24. Since substrate support 34 is larger than the substrate being processed, deposition will also occur on the outer periphery of the upper surface of substrate support 34 not covered by the wafer being processed. In a periodic cleaning process cycle, accumulations vary according to the number of wafers processes and the film thickness deposited on each wafer.

Figure 4:
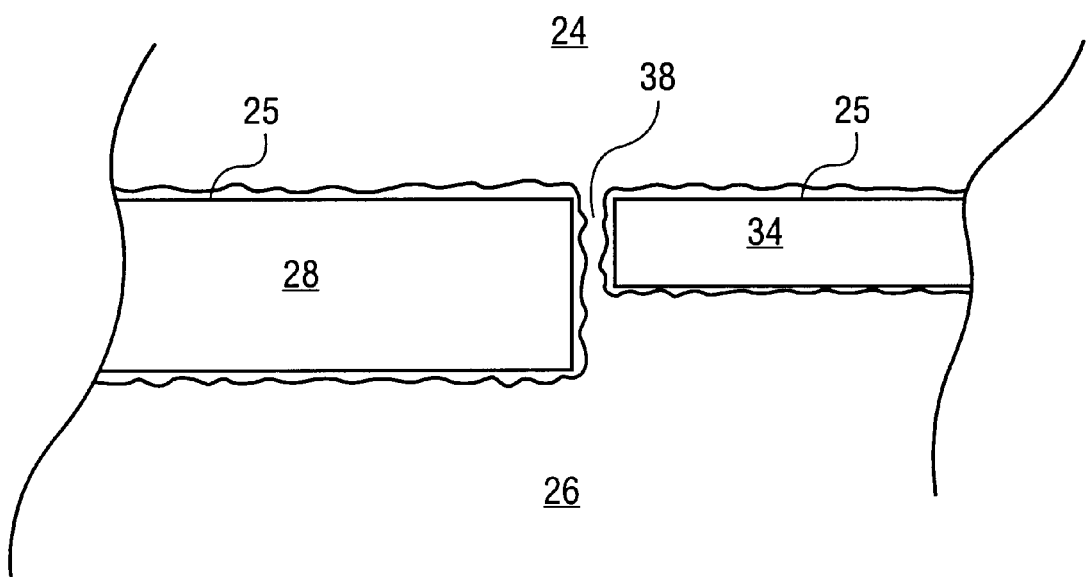
FIG. 4 is enlarged view A of FIG. 1.

FIG. 4 illustrates view A of FIG. 1 which is an enlarged view of the edges of pumping plate 34 and substrate support 28 separated by spacing 38 after the deposition process described above has taken place. Generally, FIG. 4 is representative of the chamber specific accumulations which can occur. In a representative periodic clean process, for example the deposition of $Ta_2O_5$, wafers are processed in series of 100 with each wafer receiving a 100 Å layer of $Ta_2O_5$. Such a processing cycle results in the highest accumulations, about 200 Å, on exposed areas of and the edges of pumping plate 34 nearest to substrate support 28. The thickness of the accumulation on other chamber components varies according to the temperature of the component and the degree of exposure to process gases.

The apparent division of chamber 10 into interior regions 24 and 26 by pumping plate 34 and substrate support 28 is illustrative of the obstruction of certain chamber internal regions by the interrelation of internal chamber components. Thus, the narrow spacing 38 between pumping plate 34 and substrate support 28 results in interior regions 24 and 26. The narrow spacing 38 is an area of reduced fluid communication between interior regions 24 and 26. Narrow spacing 38 is representative of an interference which occurs within processing chamber 10 such that the reaction conditions interior to the chamber beyond the preferred deposition region 24 will be dissimilar. Obstructions and restrictions like spacing 38 are not limited to resistively heated chambers such as chamber 10 but also found in other processing chambers as well. Examples from other processing apparatus where obstructions form different regions within a processing area include: portions of the horizontal position mechanism of a horizontal feed tube reactor are obstructed by the quartz boat used within the reactor so that the manner in which a quartz wafer boat utilized in a tube reactor obstructs those portions of the tube blocked by the apparatus which moves the boat; shadow rings used in some etch processes have surfaces which are not exposed to reactant gases and conversely surfaces which are exposed to and may accumulate the etched material; and substrate handling systems may result in lift mechanisms which can obstruct or otherwise restrict portions of a processing chamber.

Thus, in the specific embodiment of FIG. 1, chamber 10 is divided into first interior region 24 and second interior region 26. As a result of spacing 38 with support 28 nearly in plane with pumping plate 34, the effective chamber volume of first interior region 24 is approximately 0.6402 L.

Continuing with flow diagram 300 of FIG. 3 and as set forth in block 302, initiate a plasma within a remote plasma generator located outside of the processing chamber while there is no substrate in chamber 10. As described above, a plasma initiating gas would be utilized in a remote plasma system 60 having a manual tuner controller. In the case of an remote plasma system 60 having an automatic tuner controller, step 302 is not required since a sustainable plasma may be initiated directly from the selected cleaning gas. The plasma initiating gas may be any of the Group vm gases, such as for example, He, Ne, Xe, and Ar, or an inert gas such as $N_2$, or other gas suitable for plasma initiation. Here, inert gas or plasma initiating gas refers to those gases which do not appreciably dissociate when exposed to the microwave energy at the power levels described. In a specific embodiment, gas supply 86 contains Ar and valve and control mechanism 80 adjusts the flow of Ar to about 600 standard cubic centimeters per minute (sccm) which flows through supply line 76 into microwave applicator cavity 72.

Inside applicator cavity 72 the gas stream passes through a water cooled applicator tube where it is exposed to microwave energy levels of at least 100 W and preferably between about 1400 Watts and 3200 Watts generated by magnetron assembly 62. A representative microwave energy level suitable for a chamber 10 of FIG. 1 and the gas flows described is about 1400 Watts. In an embodiment where Ar is used to initiate a plasma, microwave energy passes through the sapphire tube and an Ar plasma is created within microwave applicator cavity 72. The plasma produces high energy or internally hot Ar which flows into remote plasma supply line 88, control valve 90, gas supply line 52 and into chamber 10. Chamber 10 is maintained at about 2.0 Torr while plasma is established in microwave applicator cavity 72. In those systems with a manual tuner, a typical time to initiate a remote plasma using an inert gas such as Ar and obtain a stable high energy Ar flow to chamber 10 is about 10 seconds or less.

Next, as set forth in block 303, activate a gas in the remote chamber to form reactive species. Gas supply 84 could contain a halogen bearing gas such as $Cl_2$, HCl, $ClF_3$, $NF_3$, $SF_6$, $F_2$ and HF. In the case of a remote apparatus 60 having an automatic tuner, steps 302 and 303 may be executed together since the gas to be activated could also be used to initiate the plasma. While maintaining the plasma within applicator 72, the flow rate of the gas to be activated is provided by valve and controller mechanism 82 which allows gas to flow through supply line 78 into microwave applicator cavity 72. Inside applicator cavity 72 the gas stream passes through the water cooled sapphire applicator tube where the cleaning gas stream is exposed to microwave energy generated by megatron assembly 62 and the initiated plasma. A representative microwave energy level is about 1400 Watts. In an embodiment where $NF_3$ is used as a cleaning gas, dissociation within applicator cavity 72 produces reactive F, some $N_2$, and trace amounts of NF and $F_2$. Using $NF_3$ has particular advantages such as its low dissociation energy and its production of multiple reactive fluorine species from each individual $NF_3$ molecule.

Next, as set forth in block 304, provide a mixture of inert gas and reactive species to an interior region of the processing chamber. Since microwave application cavity 72 is located remote to chamber 10, reactive species generated by remote plasma system 60 flow some distance along chamber supply line 88 to reach chamber 10. As a result, reactive species produced by dissociation with applicator cavity 72 could collide and recombine while flowing to chamber 10. Instead of providing reactive species to remove deposits formed within chamber 10, recombined and less reactive gases are provided to chamber 10. In an embodiment where $NF_3$ is activated in applicator 72, reactive F may recombine and instead provide $F_2$ and $NF_2$ to chamber 10. Thus, recombination of the reactive species before chamber 10 reduces the efficiency of remote plasma generating system 60 to provide reactive species into chamber interior regions 24 and 26. Providing an inert gas with the reactive species increases the probability that molecular collisions enroute to chamber 10 will be between reactive species and inert gas thereby reducing the probability of reactive species recombination.

In a representative embodiment where Ar is the inert gas and $NF_3$ is the cleaning gas, the respective flows rates could be adjusted to about 200 sccm $NF_3$ and about 400 sccm Ar. Maintaining about a 2:1 ratio between the inert gas and the reactive gas reduces the probability that reactive species produced by the reactive gas dissociation will recombine. The optimal inert gas to reactive gas ratio may also vary based on the characteristics of the specific remote plasma generator utilized and the type of reactive gas employed. Advantageous results have been achieved when the inert gas to reactive gas ratio is maintained within about 25% of the 2:1 ratio described above.

Next, as set forth in block 305, is to adjust the pressure within the processing chamber. Generally, an aspect of chamber pressure is that higher pressure tends to decrease residence time of the reactive species within the chamber. However, when cleaning initially begins within region 24 the highest amounts of deposits are present. Even though the activated species have a shorter residence time and mean free path, the likelihood of activated species reacting with and removing deposits is high. It is believed that lower pressures, on the other hand, tend to lengthen the mean free path and residence time thereby allowing dispersion of the reactive species across the interior region of the chamber. In a specific embodiment of the present invention, a chamber pressure of about 2.0 Torr results in cleaning rates which are higher on the substrate support 28 or central portion of the chamber than on walls 22 or outer portion of the chamber.

Next, as set forth in block 306, is to remove deposits formed on interior regions of the processing chamber. Removing the deposits formed on the interior chamber surfaces or cleaning the chamber is accomplished by reacting the reactive species with the deposited film on the chamber surface to form a volatile compound. For example, in a chamber used for Tantalum Pentaoxide deposition such as the chamber 10 of FIG. 1, $NF_3$ can be remotely dissociated as described above to form reactive fluorine. The reactive fluorine then reacts with and removes the Tantalum Pentaoxide formed within the interior of chamber 10. Referring to chamber 10 illustrated in FIG. 1, most of the reactive species provided to chamber 10 will react with deposits formed within interior chamber region 24. The reactive species remain mostly in the effective volume of interior region 24 because of the narrow spacing 38 between substrate support 28 and pumping plate 34. Some reactive species will interact with the tantalum pentaoxide deposits formed on the opposing edges and lower surfaces of substrate support 28 and pumping plate 34. Generally, most of the deposits removed will be those formed on surfaces within interior region 24. For example in chamber 10 of FIG. 1, deposits formed on the lower surface of showerhead 32 and the upper surfaces of pumping plate 34 and substrate support 28 would react with the reactive species to form volatile compounds.

The likely deposits to be removed can be better appreciated by referring to FIG. 4 which illustrates the enlarged view A of FIG. 1. FIG. 4 shows that portion of the chamber where pumping plate 34 and substrate support 28 are separated by spacing 38. Because of their relative positions and the chamber design, spacing 38 is at a minimum when pumping plate 34 and substrate support 28 are directly adjacent to each other or in the deposition position as shown in FIGS. 1 and 4. For a substrate support 28 in a position directly adjacent to pumping plate 34 as shown in FIGS. 1 and 4, spacing 38 is on the order of 0.088 and 0.112 inches. Reactive species introduced into chamber region 24 would easily contact and react with deposits 25 formed on the top surfaces of pumping plate 34 and substrate support 28. To a certain extent reactive species introduced within region 24 are hindered from entering region 26 because of spacing 38. As a result, chamber interior region 24 which contains the majority of deposits to be removed is the first region cleaned. During the first cleaning cycle most of the cleaning occurs in the first region 24.

Returning to flow diagram 300 of FIG. 3 and as set forth in block 307, the volatile compounds are removed from the processing chamber. As the reactive fluorine species react with the tantalum pentaoxide deposits to form volatile compounds, those compounds are exhausted from the interior regions of chamber 10 via pump 15. This process continues until the deposits formed within processing region 24 have been removed. Typical removal rates for reactive species generated from $NF_3$ with the 2:1 inert gas/reactive gas ratio described above is about 1 micron of tantalum pentaoxide per minute.

In a specific embodiment of the present invention, the first series of steps 304 through 307 represent providing an advantageous inert gas-cleaning gas mixture to a small volume processing region and a high pressure. For example, the small volume processing region could be the volume of region 24 and the high pressure could be about 2 Torr. One skilled in the art will appreciate that blocks 304, 305, 306 and 307 have been shown and described serially only for clarity in explaining the method of the present invention. In practicing the present invention, one skilled in the art could perform the steps described in blocks 304, 305, 306 and 307 in a different order or nearly simultaneously.

The next step, as set forth in block 308, is to repeat steps 304, 305, 306 and 307 until deposits formed on all interior chamber regions have been removed. This step takes into account restrictions caused by the relative positions of internal chamber components and the relationship between chamber pressure and reactive species. In the first series of steps 304, 305, 306 and 307, deposits were removed primarily from interior chamber region 24. In the second series of steps 304, 305, 306 and 307, reactive species are provided to and deposits are removed from another processing region or, alternatively, a series of processing regions.

In the representative embodiment of chamber 10 illustrated in FIG. 5, substrate support 28 has been repositioned so as to more easily allow remotely activated species into another interior region. Put another way, substrate support 28 is repositioned to increase the fluid communication between processing regions 24 and 26. In this way, reactive species entering region 24 can more easily access region 26 and react with deposits formed therein. In this representative embodiment, the interior region refers to interior regions 24 and 26. Although illustrated with the movement of support 28, other chambers will have other components alter position relative to one another in order to increase fluid communication between first and second or second and subsequent processing regions.

Turning now to FIG. 5 which shows the processing system 5 of FIG. 1 in which steps 301 through 307 above have been conducted. Chamber 10 of FIG. 5 also illustrates the placement of internal components to provide increased fluid communication to an additional processing region. In FIG. 5, resistively heated substrate support 28 in a position below pumping plate 34 which effectively increases spacing 38 which in turn leads to increased fluid communication between region 24 and region 26. As a result, reactive species entering region 24 more easily flow into region 26. For example, if the spacing of substrate support 28 in FIG. 1 is about 400 mils, the spacing in FIG. 5 is about 550 mils. Processing system 5 of FIG. 5 is otherwise similarly configured to processing system 5 of FIG. 1. As such, similar components will be referred to by the same reference numbers.

Figure 6:
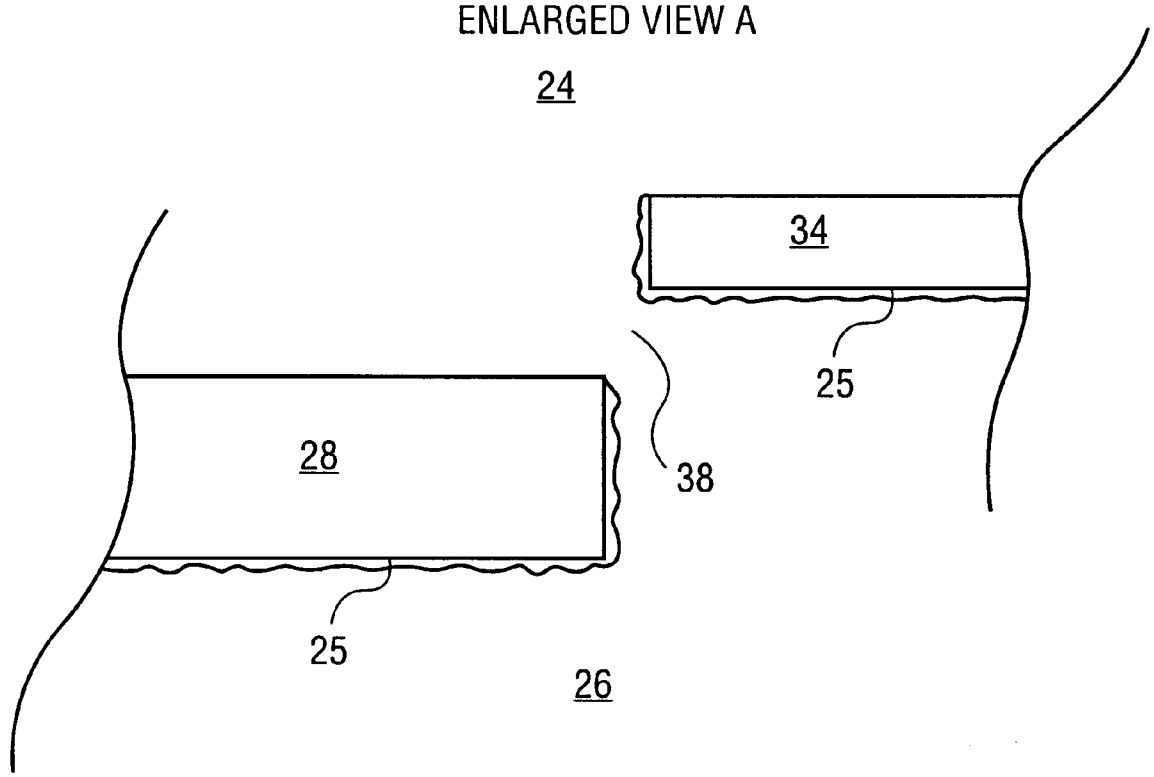
FIG. 6 is enlarged view A of FIG. 4.

Referring now to FIG. 6, which is enlarged view A of FIG. 5, the effect of processing steps 301 through 307 as well as the enlarged spacing 38 can be better appreciated. FIGS. 5 and 6 illustrate substrate support 28 in a lowered position below the plane of pumping plate 34. Spacing 38 is considerably larger compared to the spacing 38 represented in when substrate support 28 and pumping plate 34 were in nearly the same horizontal plane as in FIGS. 1 and 4. Increased spacing 38 of FIGS. 5 and 6 allows remotely generated reactive species to be transported into lower chamber interior region 26 to effect the removal of deposits formed therein. Thus, with substrate support 28 in a lowered position, the effective volume of chamber 10 is now the full volume of both internal chamber regions 24 and 26 since spacing 38 is sufficiently large so as not to restrict reactive species introduced into the chamber from each interior region of the chamber. Also shown in FIG. 6 is the removal of deposits 25 from the upper surfaces of both substrate support 28 and pumping plate 34 as a result of the first series of process steps 301 through 307. Additionally, as FIG. 6 illustrates, deposits 25 on the edge and bottom surfaces of substrate support 28 and pumping plate 34 can now be removed since these areas are more readily accessible to reactive species. Step 308 represents the desire to repeat steps 304 through 307 to remove additional deposits from additional processing regions insufficiently cleaned by the first series of steps 304 to 307.

Returning to flow diagram 300 of FIG. 3 and according to block 308, the next step is to repeat blocks 304, 305, 306 and 307 for other interior regions until all deposits are removed or all interior regions are cleaned. It is to be appreciated that the ratio of inert gas to reactive species in the gas mixture provided to the processing region may change during each of the repeated series of steps 304 through 307 or remain at some desired ratio. For example, as described above, the inert gas and the cleaning gas may maintain an advantageous 2:1 ratio. As shown in FIGS. 5 and 6, the interior region of the processing chamber as referred to by step 304 now includes a larger volume which includes interior regions 24 and 26.

Next, according to block 305, is adjusting the pressure in chamber 10. Besides increasing spacing 38, it is believed that decreased pressure and the resulting increase in residence time will also help reactive species remove deposits from interior region 26. Accordingly, the pressure within chamber 10 is decreased which spreads reactive species within interior regions 34 and 26. A typical pressure is about 900 mT or approximately half the pressure used in the first step 305.

Next, according to block 306, is to remove deposits by reacting the reactive species with the deposits to form volatile compounds. Here, most of the deposits to be reacted are those remaining on substrate support 28 and pumping plate 34 shown in FIG. 6 as well as other accumulations which may have occurred within lower deposition region 26. Cleaning continues in region 24 as reactive species react with deposits remaining in that region. As before, the reactive species react with the deposits within the processing region and form volatile compounds.

In a specific embodiment of the present invention, the second series of steps 304 through 307 represents providing an advantageous inert gas-cleaning gas mixture to a larger volume processing region at a lower pressure. For example, where the inert gas-cleaning gas mixture is provided to the combined volumes of regions 24 and 26 at a pressure of about 900 mT. Alternatively, the second series of steps are conducted at a pressure that is about half the pressure used in the first series of steps 304 through 307 in a chamber interior region having a larger volume than the chamber volume cleaned in the first series of steps.

Next, according to block 307, the volatile compounds are removed from the chamber. For example, in chamber 10 volatile compounds would be exhausted from interior regions 24 and 26 via pump 15. If desired, control valve 90 could be aligned to divert or closed in order to prevent the reactive species and inert gas from reaching chamber 10. Diverting or otherwise preventing the reactive species and inert gas from entering chamber 10 allows any residual gases from previous cleaning operations to be exhausted.

Next, according to block 308, steps 304, 305, 306 and 307 are repeated to remove deposits formed in other interior regions. Specifically contemplated is the repetition of steps 304–307 to provide reactive species to each interior chamber region created according to the specific configuration of the chamber to be cleaned by the method of the present invention. Just as substrate support 28 and pumping plate 34 create upper and lower interior regions 24 and 26, other processing chambers will have chamber regions or divisions created by the particular internal components of that chamber.

Although chamber regions 24 and 26 are described with respect to a narrowing between substrate support 28 and a pumping plate 34, these restrictions or obstructions are merely illustrative of similar problems which occur in virtually every type of processing apparatus. Some reactors employ a pumping plate as in chamber 10 while other reactors will have process specific components which also partition, restrict gas flows or otherwise decrease fluid communication between processing regions within the chamber interior. An example includes R.F. enhanced plasma deposition chambers of the type with wafer handling and susceptor lifting mechanisms which, depending on their relative positions, obstruct one another from deposition and cleaning gases. In that type of chamber, processing regions may be created by alternating the handler and lifting mechanisms in order to effectively clean the chamber interior. Another example is an etch chamber which employs a shadow ring to preclude wafer movement during processing. In that chamber, processing regions may be determined by the relative placement of the shadow ring within the chamber. Other examples include tube reactors and other processing systems that utilize track or conveyor systems to move substrates in and out of a processing area. Processing regions in these types of systems could be created by regions which are obstructed by the track system or conveyor system. Other examples of chamber type and process type chamber regions and internal component obstructions within a given chamber will occur to those of ordinary skill in the art and are within the scope of the present invention.

Next, according to block 309, is to deposit a layer of material inside the processing chamber prior to resuming processing operations. One purpose of this step is to remove residual cleaning gases, reactants and volatile compounds which if allowed to remain in the processing chamber may interfere with the subsequently deposited films. Although purging a chamber with inert gas may be sufficient in some circumstances, some processes achieve improved results by intentionally depositing a layer of film on interior chamber surfaces. The step of seasoning or intentionally depositing a layer of film in a process chamber is of particular importance where Fluorine has been used as a cleaning reactant. Residual fluorine may have detrimental effect on deposited film quality on subsequently processed substrates. Forming a layer of film in a chamber without a substrate present allows residual gases to react, form volatile compounds and be exhausted from the chamber. Additionally, particles remaining within the chamber will become entrapped in the deposited seasoning layer. In either case, the seasoning step ensures that unreacted or residual cleaning gases and by-products are removed from the chamber before resuming processing operations. In a representative embodiment such as a Tantalum deposition chamber, a layer of tantalum pentaoxide may be deposited on substrate support 28 and other interior surfaces of chamber 10 by flowing vaporized TAT-DMAE and an oxidizing gas into the chamber at a temperature of about 475° C. A representative seasoning layer for $Ta_2O_5$ about 2500 Å. The particular thickness and composition of a seasoning layer will vary depending on the chamber and type of film deposited.

The final step of the present invention, block 310, is the resumption of processing operations is chamber 10. One such processing operation is the thermal deposition of tantalum pentaoxide by mixing a tantalum precursor with an oxidizing agent at approximately 450° C. Accordingly, a substrate is placed on resistively heated substrate support 28. Heater controller 44 adjusts the power provided heater 29 to maintain the substrate at an appropriate processing temperature of about 450° C. Lift mechanism 42 positions substrate support 28 and the wafer thereupon in chamber 10 relative to showerhead 32 to a spacing of, for example, 400 mils. Gas supplies 46 and 48 of FIG. 1 contain a oxidizing gas such as oxygen or nitrous oxide and a tantalum precursor such as TAT-DMAE or TAETO. Valve and controller mechanism 50 mixes and adjusts the flow rate of the tantalum and oxidizing gases and delivers them to chamber 10. The temperature of the substrate positioned on support 28 is sufficient to form tantalum pentaoxide from the incoming gas stream.

An alternative method of the present invention may also be practiced within a single processing region of a chamber having multiple processing regions (e.g. first and second processing areas 24 and 26 of chamber 10) or in chambers having only a single processing region such as chamber 100 of FIG. 7. The alternative method is practiced by adjusting the cleaning gas/inert gas ratio and the chamber pressure. Turning now to FIG. 7, an embodiment of a chamber having a single processing region can be better appreciated.

FIG. 7 illustrates a representative chamber 100 having a single processing region. Chamber 100 could be an Ultima High Density Plasma (HDP) Chemical Vapor Deposition (CVD) chamber or Ultima HDP CVD™ chamber manufactured by Applied Materials, Inc. of Santa Clara, Calif. Chamber 100 is coupled to plasma generating apparatus 60 and gas supplies 46 and 48. Chamber 100 has a chamber body 105 and a lid 110 that together form a pressure and temperature controlled processing region 107. Substrate support 125 has a top support surface 126 and is disposed within processing region 107. Support arm 130 is coupled to chamber body 105 and supports substrate support 125.

Pressure within processing region 107 is provided by turbo pump 140 and roughing pump 150. Throttle valve and gate valve assembly 135 separates processing region 107 from turbo pump 140 and roughing pump 150 and controls the pressure within processing region 107. Plasma apparatus 60 and as well as other similarly numbered elements shown in FIG. 7 are the same as described above with regard to FIGS. 1 and 5. Although, remote plasma apparatus 60 of FIG. 7 is a manual tuner controller 68, an automatic tuner controller could also be used to dissociate the cleaning gas.

Gas supplies 48 and 46 could be any of a variety of process gases used to deposit commercial quality semiconductor films. Gas supplies 46, 48 and valve and controller 50 could be configured to provide precursor material into processing region 107 in order to deposit silicon dioxide, silicon nitride, fluorine doped silicate glass (FSG) or other low dielectric constant films, phosphorus doped silicate glass (PSG) or other premetal dielectric films. Gases from gas supplies 48 and 46 flow through gas supply inlet 52 and then through chamber gas inlets 120. Induction coils 112 provide RF energy to the portion of region 107 above substrate support top surface 126 for deposition processes conducted within chamber 100. The RF energy provided by coils 112 is used only for deposition processes and is not used during the remote cleaning processes of the present invention. In a typical plasma enhanced deposition reactor such as chamber 100 in FIG. 7, deposits would tend to form primarily in the area delineated by coils 112. The influence of coils 112 on deposition within processing region 107 results in the highest concentrations of deposits occurring on the substrate support top surface 126 and along the sides of substrate support 125 and support arm 130. To a lesser extent, deposits also form on the interior surfaces of chamber lid 110 and chamber body 105.

Figure 8:
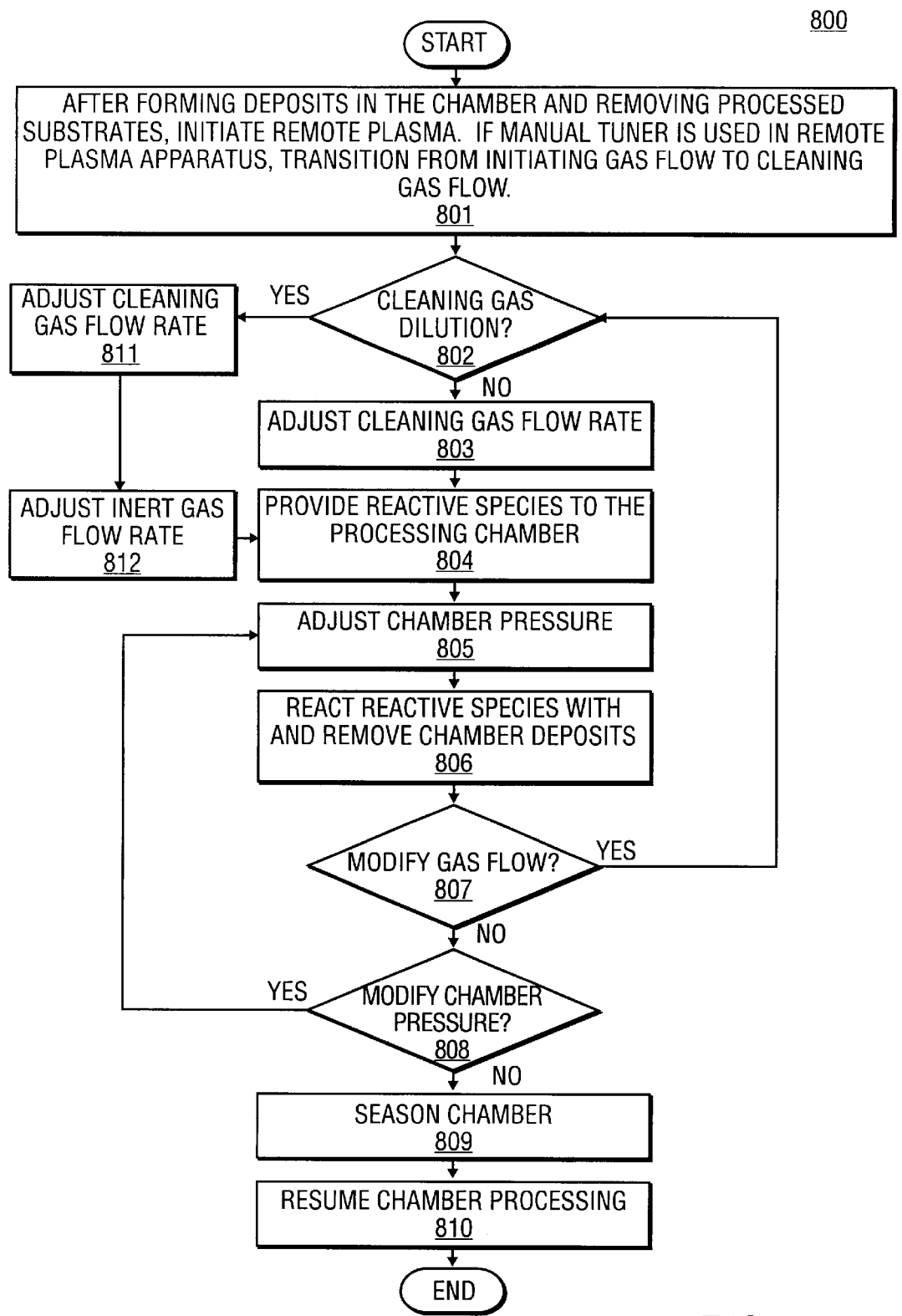
FIG. 8 is a block diagram illustrating a method of the present invention.

An alternative method of the present invention can be conducted in a single processing region of a chamber, can be better understood by turning to FIG. 8. FIG. 8 is a flow chart of the single processing region method of the present invention.

First, as set forth in block 801 of flow diagram 800 in FIG. 8, after forming deposits within the processing chamber and removing processed substrates from the chamber, initiate a plasma in the remote plasma apparatus. Since a manual tuner controller is used, the plasma is more readily initiated through the use of a plasma initiating gas. Plasma initiation could be accomplished by flowing an inert gas such as Ar through applicator 72 at a rate of about 1000 sccm. After the pressure within chamber 100 rises above 600 mT, magnetron 62 directs microwave energy to the Ar gas flow within applicator 72. Once the plasma is initiated, the cleaning gas is introduced by reducing the flow of the plasma initiating gas while increasing the flow of the cleaning gas. In a representative embodiment using Ar and $NF_3$, Ar could be flowed at about 1000 sccm with magnetron 62 producing microwave energy at about 3200 W to initiate a plasma. $NF_3$ could then be introduced into applicator 72 at about 100 sccm. Shortly thereafter, the flow rate of the cleaning gas is increased while the flow rate of the inert gas is decreased. The result provides a sustained plasma in applicator 72 with the cleaning gas flowing through the applicator and being dissociated in the plasma. In a specific example where only the cleaning gas or $NF_3$ is desired, the Ar flow rate could be stopped after a stable plasma is formed with the $NF_3$ flow. Typically in manually tuned systems, Ar is introduced at about 1000 sccm for plasma strike. The $NF_3$ is introduced and then the Ar flow is adjusted according to the desired Ar/$NF_3$ ratio. The plasma is now initiated and sustained with only the cleaning gas being introduced and dissociated in applicator 72. It is to be understood that the above process is illustrative of initiating a plasma in a manual tune remote plasma system. An automatically tuned remote plasma system could also be employed to activate or dissociate the cleaning gas directly without first using an inert gas or other plasma initiating gas to initiate a plasma within applicator 72.

Next, as set forth in block 802, is to determine whether to provide cleaning gas dilution. Cleaning gas dilution refers to the addition of an inert gas into the flow of the cleaning gas or reactive species producing gas. As step 802 indicates, the cleaning gas can be provided alone or in combination with an inert gas. If cleaning gas dilution is desired, the next step is set forth in block 811. If cleaning gas dilution is not desired, the next step is set forth in block 803.

In the case where cleaning gas dilution is not desired, proceed to block 803 which provides an adjustment to the cleaning gas flow rate. In this step, the cleaning gas flow rate is adjusted to the desired cleaning step flow rate from the flow rate utilized during plasma initiation. The cleaning gas flow rate could vary depending, for example, upon on the cost of the cleaning gas to be consumed, the power capacity of magnetron 62 and the type of film deposit to be cleaned from the chamber. Recall that the power output of magnetron 62 limits the rate of cleaning gas flow which can be completely or nearly completely dissociated. For example, it is believed that a magnetron 62 rated at 3500 W in a remote plasma apparatus 60 can achieve about 99% dissociation of a 1700 sccm $NF_3$ gas flow. For a constant magnetron power of 3500 W, gas flows greater than 1700 sccm could result in decreased dissociation percentages. For a given cleaning gas flow rate, lower magnetron power output levels could also result in lower dissociation percentages. For example, an $NF_3$ flow rate of 300 sccm and a magnetron power of 500 W may produce only about 95% dissociation while an $NF_3$ flow rate of 1500 sccm and a magnetron power of 3200 W may produce 99% or higher dissociation. After adjusting the cleaning gas flow rate to the desired rate, proceed to block 804.

In the case where cleaning gas dilution is desired, then a mixture of cleaning gas and inert gas is provided to the remote plasma applicator. Cleaning gas dilution could also be accomplished by flowing only the cleaning gas through applicator 72 with the inert gas being introduced downstream of applicator 72. In this case, proceed as set forth in block 811 which provides an adjustment to the cleaning gas flow rate. As stated with regard to block 803, the cleaning gas can be adjusted to the desired rate. After adjusting the cleaning gas flow rate, the next step in cleaning gas dilution is to adjust the inert gas flow rate to the desired rate. The adjustment of the cleaning gas and the inert gas in blocks 811 and 812 is achieved by valve and controllers 80 and 82 of FIG. 7. One of ordinary skill will appreciate that the sequence of adjusting could be reversed so that the inert gas flow is altered before the cleaning gas flow or the gas flows could be adjusted nearly simultaneously. In an illustrative embodiment of the present invention where magnetron 62 delivers 3200 W of microwave energy to applicator 72, the cleaning gas is $NF_3$ and the inert gas is Ar, representative flow rates for cleaning gas dilution according to the present invention could have a $NF_3$/Ar flow ratio of one to one or, preferably, two to one. In a specific embodiment of the present invention, the Ar gas flow rate is 750 sccm, the NF3 flow rate is 1500 sccm and the microwave energy directed to applicator 72 is 4500 W.

After adjusting the cleaning gas flow rate according to block 803 or adjusting the cleaning gas and the inert gas flows according to blocks 811 and 812, the next step, as set forth in block 804, is to provide reactive species to the processing chamber. Regardless of whether or not cleaning gas dilution is employed, cleaning gas dissociation occurs as the cleaning gas passes through applicator 72 and is exposed to the microwave energy generated by magnetron 62. So long as sufficient microwave energy is provided, cleaning gas provided into applicator 72 will dissociate and form reactive species. For example, if $NF_3$ is employed as a cleaning gas, the dissociation that occurs within applicator 72 will produce reactive F, some $N_2$, and trace amounts of NF and $F_2$. Referring again to the illustrative embodiment of chamber 100 in FIG. 7, reactive species exiting applicator 72 flow through supply line 88 past diverter 90 and into chamber supply line 52. From chamber supply line 52, reactive species are provided to processing region 107 via chamber gas inlets 120.

Turning again to FIG. 8, the next step as set forth in block 805, is to adjust the chamber pressure. One method to monitor the pressure within processing region 107 is to employ a capacitance manometer. The desired pressure within processing region 107 is obtained by adjusting the position of throttle valve/gate valve assembly 135 to increase or decrease the conductance between processing region 107 and pumps 140 and 150. Advantageous results have been obtained in pressure ranges between 1 T and 4 T or preferably about 1.8 T and 3 T.

Next, as set forth in block 806, is to react reactive species with and remove chamber deposits. Reactive species entering processing region 107 will combine with the deposits formed in processing region 107 to form volatile compounds that are exhausted from the chamber. In a typical plasma enhanced deposition reactor such as chamber 100 in FIG. 7, deposits would tend to form primarily in the area delineated by coils 112. As a result of the influence of coils 112 on deposition processes conducted within processing region 107, the highest concentrations of deposits are believed to occur on the substrate support top surface 126 and along the sides of substrate support 125 and support arm 130. Deposits also form on the interior surfaces of chamber lid 110 and chamber body 105. Reactive species entering processing region 107 react with the deposits, form volatile compounds and are exhausted from processing region 107.

The next step, as set forth in block 807, is a decision whether to modify gas flow.

In the case where a different inert or cleaning gas flow is desired, return to block 802. At block 802, determine whether cleaning gas dilution will be continued as in the case where dilution is in use, or will be implemented as in the case where non-diluted cleaning gas was employed. Based on adjustments made according to block 803, in the case of no cleaning gas dilution, or according to blocks 811 and 812, in the case of cleaning gas dilution, provide reactive species to the processing chamber (block 804) at the adjusted flow rate. The modified gas flows are employed as before and the chamber pressure can also be adjusted in block 805. Next, the reactive species can react with and remove deposits according to block 806. Once again, and for as many times as necessary, a block 807 determination could be made to return to block 802 and repeat the above steps for different gas flows and chamber pressures.

Once the number of repetitions from block 807 to block 802 are complete or in the case where no gas flow rate adjustment is desired, proceed to the next block which is block 808.

The next step, as set forth in block 808, is to determine whether chamber pressure is to be modified. This step allows the same gas flow to be provided to the chamber while providing different pressures within chamber 100. For example, determining not to modify the gas flow in block 807 followed by deciding to modify chamber pressure in block 808 results in the previously determined compositions of reactive species or reactive species/inert gas mixture being provided to processing region 107 under different pressure conditions. For example, the chamber might be maintained at a constant pressure while providing a variety of different gas flow combinations (e.g., in the case where no pressure adjustment is made in block 805 while opting to adjust gas flows in block 807). Alternatively, various pressures could be employed in chamber 100 while maintaining constant gas flow rates as in the case where no gas flow modification is selected in block 807 but chamber pressure modification is selected at block 808. Also anticipated is a cleaning method which employs multiple pressures and multiple gas flow combinations. As stated above, higher pressures generally result in shorter mean free paths for gases while lower pressures generally result in longer mean free paths for gases. For example, a higher pressure may be used for initial cleaning steps when deposits are greatest and reactions between reactive species and deposits likely. As cleaning progresses and deposits are reduced, lower pressures can be employed to increase residence time thereby increasing the likelihood of reaction between the longer residence time reactive species and the remaining deposits. Also contemplated in the method of the present invention is the advantageous use of both cleaning gas dilution and low chamber pressure to increase the residence time and decrease the recombination of the reactive species thereby improving the chamber cleaning process.

After conducting desired gas flow and pressure combinations provided through responses to blocks 807 and 808, the next step as set forth in block 809 is to season the chamber. As described above with regard to a Tantalum disposition chamber, the quality and reliability of many deposition processes are improved if steps are taken to remove from the processing region residual cleaning gases, reactive species and other volatile compounds created by the cleaning process described above. In the case where the subsequent processing operations include the deposition of silicon nitride, a layer of about 1000 Å silicon nitride is deposited within processing region 107. In the case of silicon dioxide, fluorine doped silicate glass (FSG) or other low dielectric constant films (i.e. films having a dielectric constant below 4.0), phosphorus doped silicate glass (PSG) or other pre-metal dielectric films, a layer of about 1000 Å of silicon dioxide is deposited within processing region 107.

Block 810 of flow diagram 800 sets forth the last step of the present invention which is to resume chamber processing. The cleaning process of block 800 can be repeated as desired depending upon processing requirements. Representative cleaning cycles for typical semiconductor fabrication processes include cleaning the chamber after three to five substrates are processed or after about 3 µm of film has been deposited on substrates processed in chamber 100.

The description above with regard to FIG. 8 sets forth the steps of block diagram 800 serially to provide a more through understanding of the present invention. One of ordinary skill in the art will appreciate that many of the steps may be conducted simultaneously or nearly simultaneously. Other minor deviations within flow diagram 800 are also within the scope of the present invention. For example, steps 811 and 812 could be performed in reverse order such that when cleaning gas dilution is desired, the inert gas flow is adjusted before the cleaning gas flow is adjusted.

Additionally, the chamber pressure may be adjusted (blocks 805 and 808) before the determination of whether or not to employ cleaning gas dilution (blocks 802, 811, 812 and 807).

The method of the present invention set forth in flow diagram 800 can be better appreciated by considering the following representative examples. In an embodiment of the present invention, the processing chamber is maintained at a constant pressure while a cleaning gas is provided alone and then in combination with an inert gas in accordance with the present invention. The chamber could have been used for processing operations including the deposition of a low dielectric constant (i.e. a dielectric constant less than 4.0). One such film is fluorine doped silicate glass (FSG). After conducting processing operations which form deposits within the processing chamber and removing the last wafer processed, a 3200 W plasma could be initiated in the remote plasma apparatus. An inert gas such as Argon could be used to initiate the plasma if a manual tuned microwave generator is employed. After initiation, a cleaning gas is provided to the remote plasma apparatus to generate reactive species. In this example, $NF_3$ is used and cleaning gas dilution (block 802) is not employed in this portion of the process. Next, according to block 803 the cleaning gas flow rate is adjusted to the desired flow rate. In this example, $NF_3$ is provided at about 1500 sccm. As the $NF_3$ dissociates and provides reactive species to the processing chamber (block 804) the chamber pressure is maintained at a constant pressure of about 3 Torr (block 805). Reactive species provided by the dissociated cleaning gas react with the deposits formed within the chamber to form volatile compounds that are exhausted from the chamber (block 806). In this example the reactive species are reactive fluorine which removes FSG deposits at between about 1.2 $\mu$min to 0.9 $\mu$min. In a process where the chamber is cleaned after 3 $\mu$m of deposition material is allowed to accumulate, this step lasts approximately 75 to 100 seconds.

The next step in this example is to modify gas flow in response to block 807 and employ cleaning gas dilution in response to block 802. In response to blocks 811 and 812, the cleaning gas and inert gas flows are adjusted and maintained at a level such that complete or nearly complete dissociation occurs in applicator 72. In this example, the cleaning gas is $NF_3$ and inert gas is Argon and they are provided in a 1:1 ratio, where $NF_3$ could be adjusted to 750 sccm while Ar is adjusted to 750 sccm. Alternatively, advantageous results may be obtained by providing a 2:1 ratio between the cleaning gas and the inert gas. Again using NF3 and Ar as examples, the flows could be adjusted to provide 1000 sccm NF3 while providing 500 sccm Ar. In both the 1:1 and 2:1 ratio examples where the cleaning gas is NF3 or other gas with a similar dissociation energy requirement, the total flow rate through applicator 72 is 1500 sccm which if employed with a 3500 W output from magnetron 62 is believed to produce complete or nearly complete (i.e. about 99%) dissociation of the cleaning gas.

As the cleaning gas, in this example $NF_3$, dissociates and provides reactive species to the processing chamber (block 804) the chamber pressure is maintained at a constant pressure of about 3 Torr (block 805). Reactive species provided by the dissociated cleaning gas react with the deposits formed within the chamber to form volatile compounds that are exhausted from the chamber (block 806).

Next, after the removal of deposits conducted in accordance with block 806 is complete, then the cleaning gas and inert gas flows could be modified according to blocks 807 and 802 to provide another combination of cleaning gas and inert gas or to provide cleaning gas alone. According to this specific example, gas flow and chamber pressure modifications according to blocks 807 and 808 are not desired. Instead, in accordance with block 809, the chamber is seasoned by depositing a layer of film before resuming processing operations. For example, in a processing apparatus used to deposit FSG a layer of about 1000 Å of $SiO_2$ may be deposited. In this specific example, the next step in according to block 810 is to resume FSG deposition operations in the processing chamber.

In another specific embodiment of the present invention, the cleaning method would employ at least two different pressures along with cleaning gas alone and cleaning gas diluted by an inert gas. Initially, a high pressure is used when the amount of deposits is greatest followed by a low pressure clean when the amount of deposits is reduced and dispersed within the chamber. The chamber could have been used for processing operations such as the deposition of a premetal dielectric. One such film is phosphorus doped silicon glass (PSG). After conducting processing operations which form deposits within the processing chamber and removing the last wafer processed, a 3200 W plasma could be initiated in the remote plasma apparatus. As described above, an inert gas such as Argon could be used to initiate the plasma if a manual tuned microwave generator is employed. After initiation, a cleaning gas is provided to the remote plasma apparatus to generate reactive species. In this example, $NF_3$ is used and cleaning gas dilution (block 802) is not employed in this portion of the process. Next, according to block 803 the cleaning gas flow rate is adjusted to the desired flow rate. In this example, $NF_3$ is provided at about 1500 sccm. As the $NF_3$ dissociates and provides reactive species to the processing chamber (block 804) the chamber pressure is maintained at a constant pressure of about 3 Torr (block 805). Reactive species provided by the dissociated cleaning gas react with the deposits formed within the chamber to form volatile compounds that are exhausted from the chamber (block 806).

The next step in this representative remote clean process of the present invention is to modify the gas flow in response to block 807 and employ cleaning gas dilution in response to block 802. In response to blocks 811 and 812, the cleaning gas and inert gas flows are adjusted. In this example where the cleaning gas is $NF_3$ and inert gas is Argon, the gases could be provided in a 1:1 ratio such as where $NF_3$ is 750 sccm and Ar is 750 sccm. Alternatively, better cleaning uniformity may be obtained by providing a 2:1 ratio between the cleaning gas and the inert gas as in where the gas flows are adjusted to provide 1000 sccm $NF_3$ and 500 sccm Ar or, preferably, 1500 sccm $NF_3$ and 750 sccm Ar. As in the previous example, total flow through applicator 72 and microwave power are maintained at a level where complete or nearly complete dissociation of the cleaning gas is achieved.

As the cleaning gas inert gas mixture dissociates and provides reactive species to the processing chamber (block 804) the chamber pressure is decreased to a pressure of about 1.8 Torr (block 805). Reactive species have a longer residence time at the lower pressure thereby increasing the likelihood that they will react with the remaining deposits formed within the chamber to form volatile compounds that are exhausted from the chamber (block 806).

After the removal of deposits conducted in accordance with block 806 is complete, the chamber is seasoned by depositing a layer of film in accordance with block 809 before resuming processing operations. For example, in a processing apparatus used to deposit PSG a layer of about 1000 Å of SiO$_2$ may be deposited in processing region 107 while no substrate is present within region 107. Next according to block 810, resume the deposition of PSG films on substrates in the processing chamber.

In addition to the above specific embodiments, it is anticipated that several gas flow rates and chamber pressures may be employed and modified through successive iterations of the steps in block diagram 800. It is also anticipated that the methods of block diagram 800 may be employed with the methods of block diagram 300. One result illustrative of such a combined method would be the employment of the gas mixing and chamber pressure adjustments of block diagram 800 into the multiple interior regions formed within a processing reactor 10.

Figure 9:
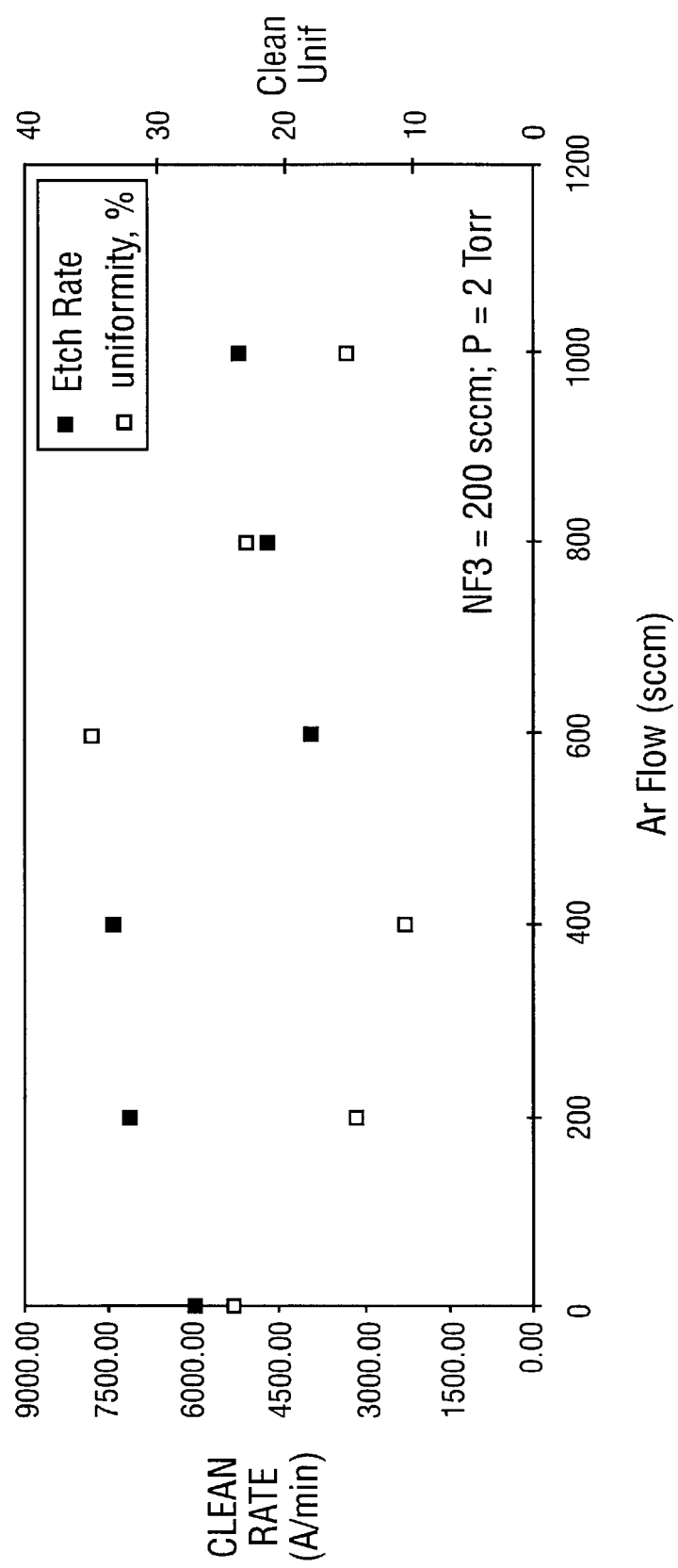
FIG. 9 is a graph illustrating the effect of Argon flow on cleaning rate and cleaning uniformity.
Figure 10:
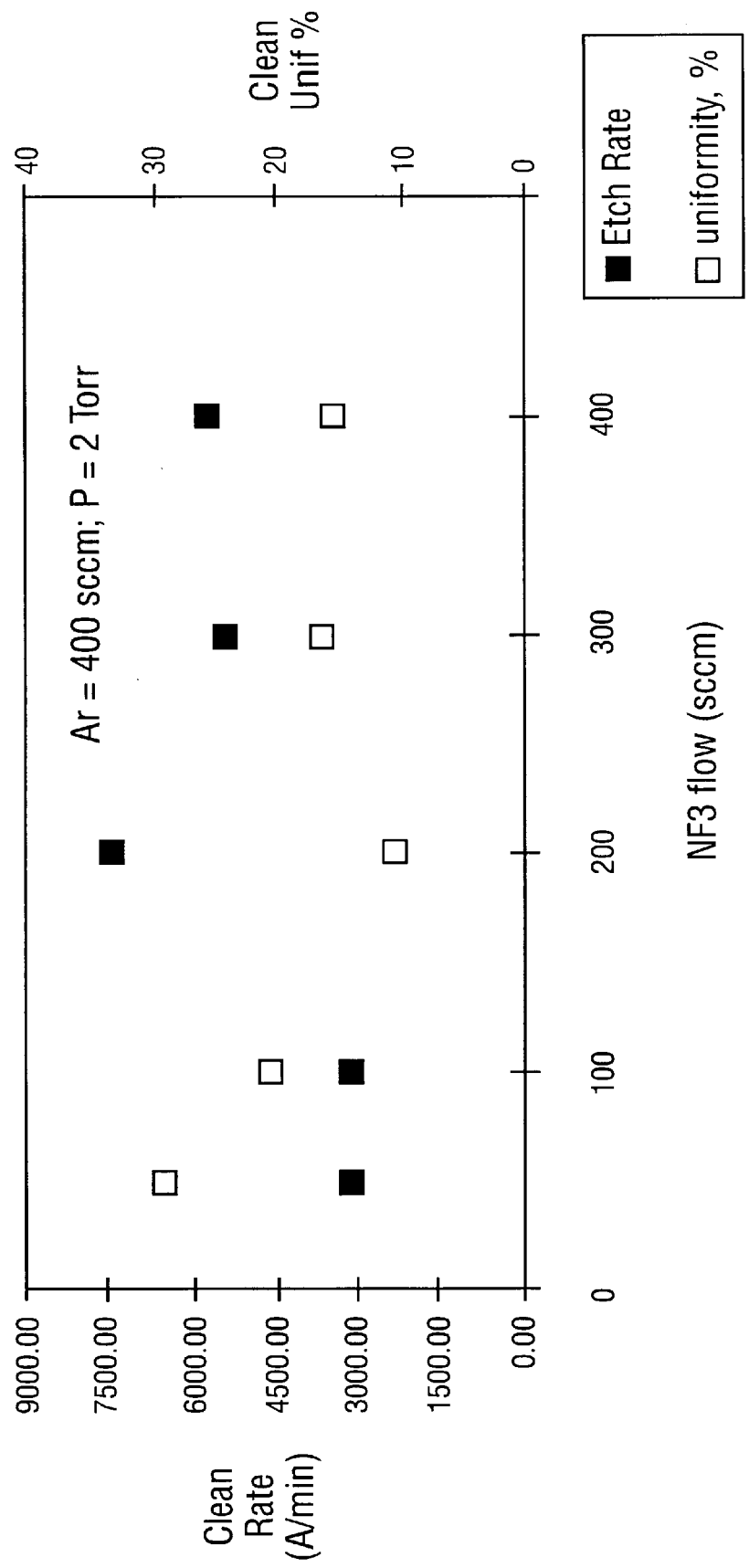
FIG. 10 is a graph illustrating the effect of NF3 flow on cleaning rate and cleaning uniformity.
Figure 11:
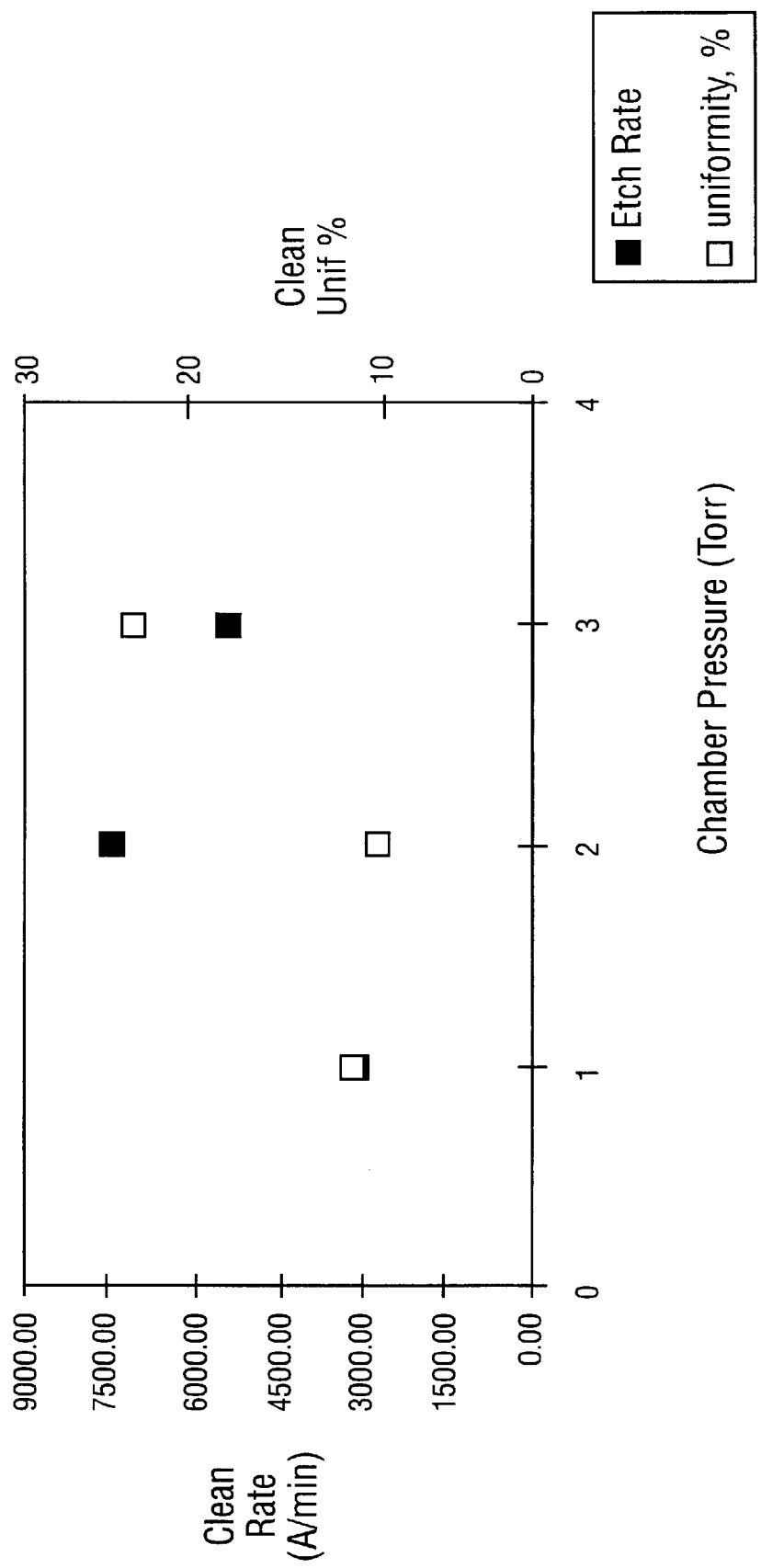
FIG. 11 is a graph illustrating the effect of chamber pressure on cleaning rate and uniformity.

Referring now to FIGS. 9, 10 and 11, the advantageous cleaning rate and cleaning uniformity achieved by a method of the present invention set forth in FIG. 3 can be better appreciated. The results illustrated in FIGS. 9, 10 and 11 were obtained by measuring the initial thickness and uniformity of a SiO$_2$ film deposited on several 200 mm wafers then exposing those wafers to different process conditions within a chamber 10 to determine the effect of the different process conditions on cleaning rate and uniformity. After exposure to a particular cleaning process environment, film thickness and uniformity was again measured and compared to the original thickness and uniformity. Each graph represents a different variable such as various Ar flow rates in FIG. 9, various NF$_3$ flow rates in FIG. 10 and various chamber pressures in FIG. 11.

FIG. 9 represents the effect of increased Argon flow rate on clean rate and uniformity while chamber pressure and NF$_3$ flow are constant. While maintaining a chamber pressure of 2 Torr and a NF$_3$ flow rate of 200 sccm, Ar flow was varied from 0 to 1000 sccm. The flow rate of 400 sccm provided the highest clean rate of about 7500 Å/min and the lowest uniformity of about 11%. As Ar flow rate increased above 400 sccm or as the NF$_3$ flow is further diluted by the higher Ar flow, the cleaning rate decreased to between about 4100 and 5800 Å/min while the uniformity increased to as much as 35%. As the Ar flow decreased below 400 sccm the cleaning rate decreased below 7500 Å/min to as low as 6000 Å/min while the clean uniformity increased to between 12% to 25%.

FIG. 10 represents the effect of increased NF$_3$ flow on cleaning rate and uniformity. While maintaining chamber pressure at 2 Torr and Ar flow rate at 400 sccm, NF$_3$ flow rate was increased from 0 sccm to 400 sccm. At 200 sccm of NF$_3$, the cleaning rate was about 7500 Å/min with a clean uniformity of about 10%. Increasing NF$_3$ flow above 200 sccm led to a decreased clean rate of about 6000 Å/min and an increased clean uniformity of about 15%. Decreasing the NF$_3$ flow rate below 200 sccm decreased the cleaning rate to about 3000 Å/min while increasing the clean uniformity to between 20% to 30%.

FIG. 11 represents the effect of chamber pressure on cleaning rate and clean uniformity for constant Ar and NF$_3$ flow rates. At 2 Torr chamber pressure the clean uniformity was about 10% while the clean rate was about 7500 Å/min. At pressures below 2 Torr the clean uniformity is only moderately increased however the cleaning rate decreases to about 300 Å/min. At pressures above 2 Torr, the uniformity is above 20% while the cleaning rate is only about 3000 Å/min. A higher cleaning rate is indicative of a more rapid clean and a low cleaning uniformity indicates that the cleaning radicals are more evenly applied throughout the chamber interior thereby reducing the likelihood that some chamber components may be overcleaned and damaged. Thus, a review of the results obtained and illustrated in FIGS. 9, 10 and 11, an advantageous clean having the highest cleaning rate and lowest uniformity could be achieved using the methods of the present invention in a chamber 10 at a pressure of 2 Torr and Ar/NF$_3$ mixture activated in applicator 72 and provided to the chamber in a 2:1 ratio or the specific embodiment of 400 sccm Ar and 200 sccm of NF$_3$ and a microwave power of 1400 Watts.

Figure 12:
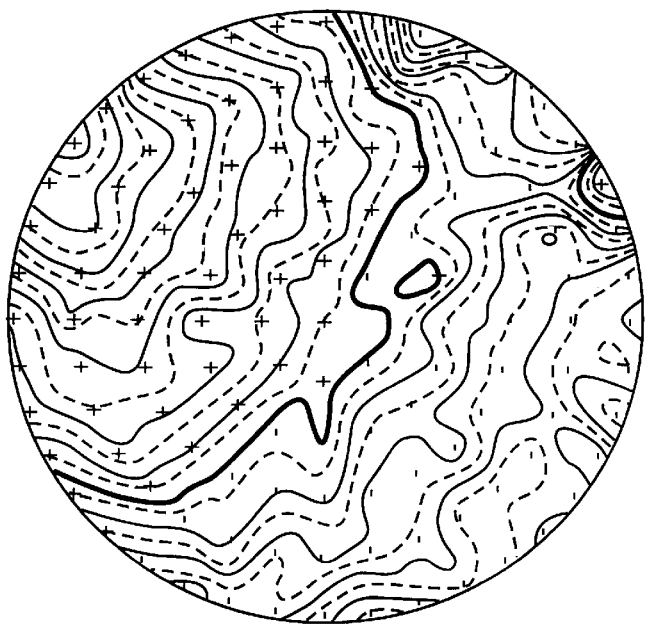
FIG. 12 is a thickness map of a 300 mm wafer exposed to a cleaning method according to the present invention.

FIG. 12 represents alternative results obtained in a test conducted in a chamber similar to chamber 100 of FIG. 7. In this test a silicon dioxide film was deposited on a 300 mm wafer and the initial thickness and uniformity of the film was measured. The wafer was then placed in a chamber 100 and exposed to cleaning process conditions similar to the cleaning method set forth in FIG. 8. After conducting the cleaning process, the wafer was removed from the chamber and the thickness and uniformity of the film was again measured. These post cleaning measurements are illustrated in FIG. 12. The method of FIG. 8 was conducted in a chamber 100 with a 1:2 Ar/NF$_3$ ratio, in this embodiment a 750 sccm Ar flow and 1500 sccm NF$_3$ flow were used, with a microwave power of 4500 Watts and a chamber pressure of 3 Torr. This specific embodiment of the method of FIG. 8 achieved a cleaning uniformity of 4.34% and a cleaning rate of 2000 Å/min.

While specific embodiments of the invention have been shown and described, further modifications and improvements will occur to those skilled in the art. It is desired that it be understood, therefore, that the invention is not limited to the particular form shown and it is intended in the appended claims which follow to cover all modifications which do not depart from the spirit and scope of the invention.

We claim:

1. A method of cleaning from a processing chamber deposits formed on interior surfaces of the processing chamber wherein said processing chamber interior surfaces include a first region and a second region said second region being different from said first region, said method comprising the steps of:
    (a) dissociating a gas mixture outside said processing chamber to form reactive species, said gas mixture comprising an inert gas and a cleaning gas;
    (b) providing said reactive species to said processing chamber;
    (c) reacting said reactive species with said deposits in said processing chamber first region;
    (d) forming volatile compounds from said deposits formed in said processing chamber first region;
    (e) removing from said processing chamber said volatile compounds formed from deposits formed in said processing chamber first region;
    (f) increasing the fluid communication between said processing chamber first and second regions;
    (g) reacting said reactive species with said deposits in said processing chamber second region;
    (h) forming volatile compounds from said deposits formed in said processing chamber second region; and
    (i) removing from said processing chamber said volatile compounds formed from deposits formed in said processing chamber second region.

2. The method according to claim 1 wherein the ratio of said inert gas to said cleaning gas is about 2 to 1.

3. The method according to claim 1 wherein said step of dissociating a gas mixture outside said processing chamber to form reactive species is conducted in a microwave powered remote plasma apparatus.

4. The method of claim 1 wherein said step of reacting said reactive species with deposits formed in said processing chamber first region is performed at a first pressure and said step of reacting said reactive species with deposits formed in said processing chamber second region is performed at a second pressure wherein said second pressure is different from said first pressure.

5. The method of claim 2 wherein said first gas is an inert gas and said second gas is a halogenated gas.

6. The method of claim 5 wherein said halogenated gas is $NF_3$.

7. The method according to claim 3 wherein said microwave power causes more than 99% dissociation of said cleaning gas within said gas mixture.

8. The method of claim 4 wherein said first pressure is greater than said second pressure.

9. The method of claim 4 wherein said first pressure is about twice the second pressure.

10. The method of claim 4 wherein said first pressure is about 2 Torr.

11. A method of removing deposits formed in a processing chamber as a result of deposition operations performed on a substrate disposed within the processing chamber, the method comprising the steps of:
(a) activating a cleaning gas in a remote chamber separate from said processing chamber to form reactive species from said cleaning gas;
(b) providing an inert gas which mixes with said reactive species to form a gas mixture comprising reactive species;
(c) providing said gas mixture to said processing chamber while maintaining said processing chamber at a first pressure;
(d) while maintaining said processing chamber at said first pressure, reacting said reactive species with said deposits to form volatile compounds and thereafter removing from said processing chamber said volatile compounds formed at said first pressure;
(e) providing said gas mixture comprising reactive species to said processing chamber while maintaining said processing chamber at a second pressure that is different from said first pressure;
(f) while maintaining said processing chamber at said second pressure, reacting said reactive species with said deposits to form volatile compounds and thereafter removing from said processing chamber said volatile compounds formed at said second pressure; and
(g) conducting processing operations in said processing chamber to form a film on interior surfaces of said processing chamber without a substrate disposed within said chamber.

12. A method according to claim 11 wherein said second pressure is lower than said first pressure.

13. A method according to claim 11 wherein said second pressure is about half of said first pressure.

14. A method according to claim 11 wherein the step of providing an inert gas which mixes with said reactive species to form a gas mixture comprising reactive species further comprises an inert gas flow rate that is twice the flow rate of the cleaning gas used to form reactive species.

15. A method according to claim 11 further comprising the step of providing said gas mixture comprising reactive species to a first processing region of said processing chamber while maintaining said first pressure and providing said gas mixture comprising reactive species to a second processing region different from said first processing region while maintaining said second pressure in said processing chamber.

16. A method of removing deposits comprising Tantalum formed on interior surfaces of a processing chamber as a result of substrate processing operations conducted to deposit a film comprising Tantalum on a substrate, said processing chamber comprising a first processing region and a second processing region different from said first processing region, the method comprising the steps of:
(a) initiating a plasma in a remote chamber outside of said processing chamber;
(b) activating said cleaning gas with said plasma to generate reactive species from said cleaning gas;
(c) providing an inert gas that mixes with said reactive species forming a gas mixture comprising inert gas and reactive species;
(d) providing said gas mixture to the first processing region within said processing chamber;
(e) while maintaining said processing chamber at a first pressure, reacting said reactive species with said film comprising Tantalum within said first processing region to form volatile compounds;
(f) removing said volatile compounds formed within said first processing region from said processing chamber;
(g) increasing the fluid communication between said first and said second processing regions;
(h) providing said gas mixture to a second processing region within said processing chamber;
(i) while maintaining said processing chamber at a second pressure, reacting said reactive species with said film comprising Tantalum within said second processing region to form volatile compounds; and
(j) removing said volatile compounds formed within said second processing region from said processing chamber.

17. The method according to claim 16 comprising the further step following step (j) of conducting processing operations in said processing chamber without a substrate present in said chamber to form a film comprising Tantalum on interior surfaces of said processing chamber wherein said processing operations are conducted after removing from said processing chamber said volatile compounds formed from said first and second processing regions.

18. The method according to claim 16 wherein said cleaning gas is a halogen.

19. The method according to claim 16 wherein said cleaning gas comprises fluorine.

20. The method according to claim 16 wherein said cleaning gas is $NF_3$.

21. The method according to claim 16 wherein said inert gas is selected from the group consisting of Ar, Xe, Ne, He, and $N_2$.

* * * * *